(12) United States Patent  
Yamasaki et al.

(10) Patent No.: US 7,361,595 B2
(45) Date of Patent: Apr. 22, 2008

(54) TRANSITION METAL THIN FILM FORMING METHOD

(75) Inventors: Hideaki Yamasaki, Nirasaki (JP); Susumu Arima, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 299 days.

(21) Appl. No.: 10/471,588

(22) PCT Filed: Mar. 14, 2002

(86) PCT No.: PCT/JP02/02425

§ 371 (c)(1),
(2), (4) Date: Jun. 28, 2004

(87) PCT Pub. No.: WO02/075011

PCT Pub. Date: Sep. 26, 2002

(65) Prior Publication Data

US 2004/0231585 A1    Nov. 25, 2004

(30) Foreign Application Priority Data

Mar. 16, 2001   (JP)   ............................. 2001-077115
Jun. 13, 2001   (JP)   ............................. 2001-179399

(51) Int. Cl.
    *H01L 21/44*    (2006.01)
(52) U.S. Cl. ................................. 438/680; 257/E21.17

(58) Field of Classification Search ................ 438/680, 438/681, 686, 690
See application file for complete search history.

(56) References Cited

U.S. PATENT DOCUMENTS 5,620,925 A * 4/1997 Nakata et al. ............... 438/641
6,271,131 B1* 8/2001 Uhlenbrock et al. ......... 438/681

OTHER PUBLICATIONS

Park S-E et al: "A Novel Process to Improve the Suface Roughness of RU02 Film Deposited by Metallorganic Chemical Vapor Deposition", Electrochemical and Solid-State Letters, IEEE Service Center, Piscataway, NJ, US, vol. 1, No. 6, Dec. 1, 1998. pp. 262-264, XP000786831 ISSN: 109-0062.
Kwon J-H et al: "Preparation of Pt thin films deposited by metalorganic chemical vapor deposition for ferroelectic thin films", Thin Solid Films, Elsevier-Sequoia S.A. Lausanne, CH, vol. 303, No. 1-2, Jul. 15, 1997, pp. 136-142, XP004087624 ISSN: 0040-6090.

(Continued)

*Primary Examiner*—Scott B. Geyer
(74) *Attorney, Agent, or Firm*—Crowell & Moring LLP

(57) ABSTRACT

A semiconductor substrate is placed in a predetermined processing vessel, and oxygen gas activated by, e.g. conversion into a plasma is supplied onto an insulating film. The surfaces of an interlevel insulating film and insulating film are exposed to the activated oxygen gas. After that, a transition metal film, e.g. a ruthenium film, is formed by CVD.

37 Claims, 12 Drawing Sheets

OTHER PUBLICATIONS

Lee J-H et al: "Effects of hydrogen plasma pretreatment on characteristic of copper film deposited by remote plasma CVD using (hfac)Cu(TMVS)", Thin Solid Films, Elsevier-Sequoia S.A. Lausanne, CH, vol. 375, No. 1-2, Oct. 31, 2000, pp. 132-136, XP 004237519 ISSN: 0040-6090.

"Deposit and Etch Technique for Making Smooth, Low Resistivity Tungsten Films", Research Disclosurek, Kenneth Mason Publicationsk, HAMPSHIREK, GB, No. 305, Sep. 1, 1989, p. 633 XP000070496 ISSN: 0374-4353.

Saito Y et al: "Tungsten Chemical Vapor Deposition on Silicon and Silicon Dioxide With Plasma Excited Hydrogen", Japanese Journal of Applied Physics, Publication Office Japanese Journal of Applied Phnysics. Tokyo, JP, vol. 33, No. 7B, PART 1, Jul. 1, 1994, pp. 4413-4416, XP000595755 ISSN: 0021-4922.

Nabatame T et al: "Properties of Ruthenium Films Prepared by Liquid Source Metalorganic Chemical Vapor Deposition Using RU(ETCP)2 With Tetrahydrofuran Solvent", Japanese Journal of Applied Physics, Publication Office Japanese Journal of Applied Physics. Tokyo, JP, vol. 39, No. 11B, PART 2, Nov. 15, 2000, pp. L1188-L1190, XP001020539 ISSN: 0021-4922.

* cited by examiner

Disturbance ion effect under detection limit

TRANSITION METAL THIN FILM FORMING METHOD

BACKGROUND OF THE INVENTION

The present invention relates to a thin film forming method and thin film forming apparatus for forming a metal film.

As the integration degrees of integrated circuits are increasing, in a DRAM (Dynamic Random Access Memory) which is constituted by a transistor and capacitor, reduction in area of a memory cell and increase in memory capacity are required. For this request, a technique for increasing the capacity of a memory cell without increasing its area by using a material with a high dielectric constant such as tantalum oxide ($Ta_2O_5$) as a dielectric film (capacitor insulating film) constituting a capacitor has been proposed.

When a material with a high dielectric constant such as tantalum oxide is used as a dielectric film, an expected dielectric constant is obtained by performing postprocessing such as annealing, UV processing, and the like after forming a tantalum oxide film. At this time, in order to prevent oxygen from being eliminated from the dielectric material, which is an oxide, postprocessing is generally performed in an atmosphere containing oxygen. For this reason, when tungsten or titanium nitride is used as a storage electrode, it is oxidized. Accordingly, a metal material which is not easily oxidized or exhibits conductivity even after oxidization, such as ruthenium is used as the storage electrode.

In order to increase the memory capacity in a DRAM, a technique for increasing the memory capacity of a memory cell without increasing its area by forming a capacitor to have a cylinder shape or stacked electrode structure and increasing its substantial area has been proposed. For example, when a cylinder capacitor structure is used in this technique, electrodes are formed to have larger steps. For this reason, in forming a conductive film as an electrode, CVD (chemical vapor deposition), by which the conductive film can be formed with a good step coverage, is used.

In using ruthenium in thermal CVD, $Ru(C_2H_5C_5H_5)_2$ {Ru (EtCp)$_2$} is used as a source gas, and oxygen gas is added to this source gas.

However, in forming a ruthenium film by thermal CVD, when ruthenium is not attached in advance to the underlying layer on which a film is to be formed, a ruthenium film is unlikely to grow by CVD. Conventionally, a thin ruthenium film (seed layer) is generally formed by PVD, and a ruthenium film having a desired thickness is formed with a good step coverage by CVD.

When a thin film of ruthenium is to be formed only by thermal CVD using ruthenium source gas and oxygen gas, it takes about 20 min since a substrate is heated to a predetermined temperature, and supply of the above gas onto the substrate is started until a film starts to be formed on the surface of the underlying layer. Even when the supply amount of the gas is increased to have tens of times as high concentration as usual in order to reduce time until the film starts to be formed, the film formation start time requires several min. In addition, only a film with a poor quality, e.g., a poor smoothness is formed.

To avoid such a problem, conventionally, a seed layer is first formed by PVD. However, it is difficult to form a film with a good step coverage, and thus it is very difficult to form a seed layer on the side wall of a hole with a high aspect ratio having, e.g., a diameter of 0.1 μm and depth of over 0.5 μm. When a cylinder capacitor structure is to be formed, it is required that a ruthenium film be formed with a good step coverage in a small hole with a high aspect ratio. As microminiaturization is increasingly required, it is becoming difficult to form a seed layer uniformly on a side wall.

DISCLOSURE OF THE INVENTION

The present invention has been made to solve the above problems, and has as its object to form a thin film with a good step coverage and good quality even when an underlying layer has a smaller stepped shape with a high aspect ratio.

According to an embodiment of the present invention, there is provided a thin film forming method comprising causing an activated gas to come into contact with a film formation region of a substrate to be processed to perform preprocessing for the substrate, and then forming a thin metal film made of a transition metal on the film formation region of the substrate which has been subjected to the preprocessing by thermal CVD using a source gas of the transition metal and oxygen gas.

According to this film forming method, the source gas and oxygen gas are supplied onto the film formation region which has been further activated by heating.

In the above thin film forming method, the activated gas is, e.g., activated oxygen. Alternatively, the activated gas may be an activated inert gas such as activated argon.

Also, the source gas of the transition metal is, e.g., an organometallic compound comprised of the transition metal and at least one cyclopentadiene ring. The transition metal may include ruthenium.

In addition, the activated gas is obtained by activating the original gas in a location spaced from the substrate. The activated gas may be generated by, e.g., exciting the original gas using microwaves.

According to an embodiment of the present invention, there is provided a thin film forming apparatus comprising preprocessing means for causing an activated gas to come into contact with a film formation region of a substrate to be processed, source gas supply means for supplying a source gas of a transition metal and oxygen gas onto the film formation region of the substrate, and heating means for heating the substrate.

According to this thin film forming method, after the film formation region is activated by the preprocessing means, the source gas and oxygen gas are supplied, and the substrate is heated to form a metal film of the transition by thermal CVD.

In the above thin film forming apparatus, the preprocessing means and source gas supply means may be disposed in a single processing vessel, the heating means may be disposed on a susceptor arranged in the processing vessel, and the substrate may come into contact with the activated gas on the susceptor, may come into contact with the source gas and oxygen gas, and may be heated by the heating means.

According to another embodiment of the present invention, there is provided a thin film forming method comprising the step of causing an activated gas to come into contact with a film formation region of a substrate to be processed to perform preprocessing for the substrate, and the step of forming a thin metal film made of a transition metal on the film formation region of the substrate which has been subjected to the preprocessing by CVD using a source gas of the transition metal and additive gas.

According to this thin film forming method, the source gas and additive gas are supplied onto the activated thin film formation region.

According to another embodiment of the present invention, there is provided a thin film forming method comprising supplying a source gas of a transition metal, additive gas, and activated gas onto a thin film formation region of a substrate to be processed to form a thin metal film made of the transition metal by CVD.

According to this thin film forming method, the source gas of the transition metal comes into contact with the activated gas as well as the additive gas.

In the above thin film forming method, the source gas of the transition gas may be supplied onto the thin film formation region of the substrate by repeating a cycle of supply for a first time and then suspension of supply for a second time a predetermined number of times.

According to another embodiment of the present invention, there is provided a thin film forming method comprising supplying a source gas of a transition metal and activated additive gas onto a thin film formation region of a substrate to be processed to form a thin metal film made of the transition metal by CVD.

According to this film forming method, the source gas of the transition metal comes into contact with the activated gas.

In the above thin film forming method, the source gas of the transition gas may be supplied onto the thin film formation region of the substrate by repeating a cycle of supply for a first time and then suspension of supply for a second time a predetermined number of times.

In the above thin film forming method, after performing preprocessing for the substrate by causing the activated gas to come into contact with the film formation region of the substrate to be processed, a thin metal film made of the transition metal may be formed by CVD.

In the above-described thin film forming method, the activated gas contains, e.g., activated oxygen. As the activated gas, a gas obtained by activating any one of oxygen gas, nitrous oxide gas, nitric oxide gas, and vapor may be used, and particularly, activated oxygen gas may be used.

In the above-described thin film forming method, the activated gas may be an activated inert gas. As an activated inert gas, activated argon gas may be used.

In the above thin film forming method, the additive gas may be any gas that contains oxygen. As the additive gas, any one of oxygen gas, nitrous oxide gas, nitric oxide gas, and vapor may be used, and particularly, oxygen gas may be used.

In the above thin film forming method, the activated gas or activated additive gas may be obtained by activating the original gas in a location spaced from the substrate. The activated gas or activated additive gas may be generated by exciting the original gas using microwaves.

In the above thin film forming method, the source gas of the transition metal may be an organometallic compound comprised of the transition metal and at least one cyclopentadiene ring. For example, the transition metal may be ruthenium.

According to another embodiment of the present invention, there is provided a thin film forming apparatus comprising preprocessing means for causing an activated gas to come into contact with a film formation region of a substrate to be processed, and source gas supply means for supplying a source gas of a transition metal and additive gas onto the film formation region of the substrate, wherein a thin metal film made of the transition metal is formed on the substrate by CVD.

According to this thin film forming apparatus, after activating the film formation region by the preprocessing means, the source gas and additive gas are supplied to form the thin metal film made of the transition metal by CVD.

According to another embodiment of the present invention, there is provided a thin film forming apparatus comprising source gas supply means for supplying a source gas of a transition metal, additive gas, and activated gas onto a film formation region of a substrate to be processed, wherein a thin metal film made of the transition metal is formed on the substrate by CVD.

According to this thin film forming apparatus, the source gas, additive gas, and activated gas are supplied to form the thin metal film made of the transition metal by CVD.

According to another embodiment of the present invention, there is provided a thin film forming apparatus comprising source gas supply means for supplying a source gas of a transition metal and activated additive gas onto a film formation region of a substrate to be processed, wherein a thin metal film made of the transition metal is formed on the substrate by CVD.

According to this thin film forming apparatus, the source gas and activated additive gas are supplied to form the thin metal film made of the transition metal by CVD.

In the above thin film forming apparatus, preprocessing means for causing the activated gas to come into contact with the film formation region of the substrate may be provided.

Alternatively, the preprocessing means and source gas supply means may be provided in a single processing vessel, and preferably, the substrate comes into contact with the activated gas on a susceptor and comes into contact with the source gas and additive gas.

DESCRIPTION OF THE PREFERRED EMBODIMENTS

Embodiments of the present invention will be described below with reference to the drawings.

Figure 1:
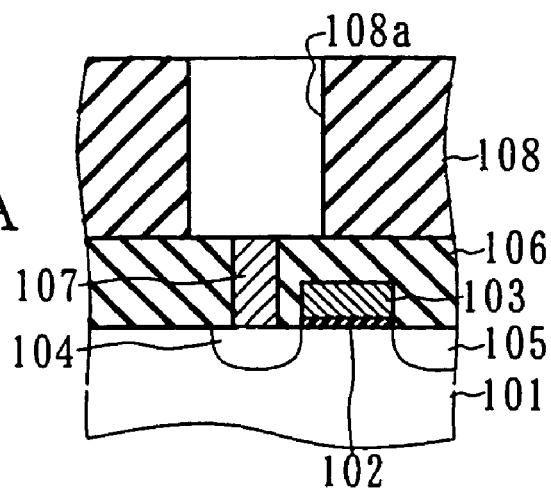
FIG. 1 shows sectional views of the steps in manufacturing a semiconductor device using a thin film forming method according to an embodiment of the present invention.
Figure 1:
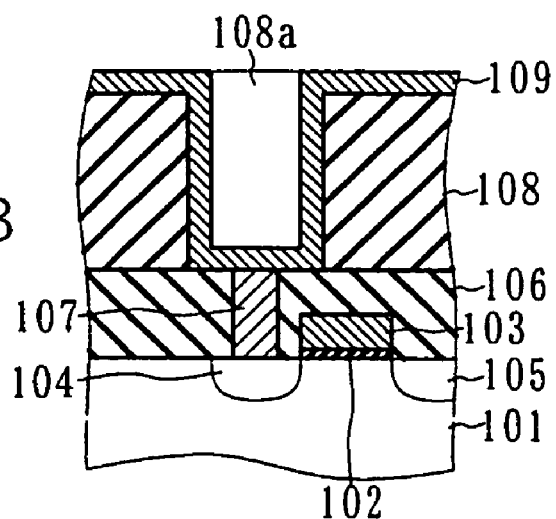
Figure 1:
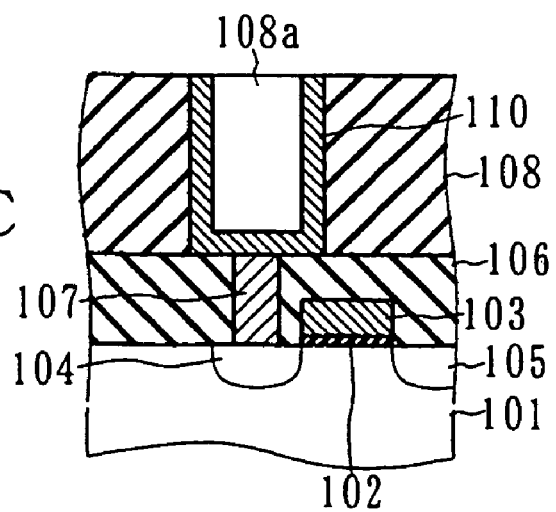

An embodiment of the present invention will be described. First, an example of a thin film forming method according to this embodiment will be described with reference to FIGS. 1 and 2. As shown in FIG. 1A, a gate electrode 103 is formed on a semiconductor substrate 101 made of, e.g., silicon through a gate insulating film 102. A source 104 and drain 105 are formed on the two sides of the gate electrode 103, respectively. An interlevel insulating film 106 is formed on the semiconductor substrate 101 to cover the gate electrode 103. A contact plug 107 is formed through the interlevel insulating film 106 to connect to, e.g., the source 104. Then, an insulating film 108 made of silicon oxide is formed on the interlevel insulating film 106, and an opening 108a having a diameter of 0.1 μm and a depth of 0.5 to 1 μm is formed in the corresponding region of the insulating film 108 above the contact plug 107. The opening 108a may be formed using known photolithography and etching techniques.

Next, the semiconductor substrate 101 is placed in a predetermined processing vessel. Oxygen gas (activated gas) activated by, e.g., conversion into a plasma is supplied onto the insulating film 108, so that the surfaces of the interlevel insulating film 106 and insulating film 108 are exposed to the activated oxygen gas (preprocessing). The partial pressure of the activated oxygen gas is set to about 444 Pa in the above-described processing vessel, and the processing time is set to 300 sec. Note that an inert gas such as argon may be activated for supply in place of oxygen gas.

Activation of these gases may be performed by, e.g., generating plasmas of the gases. Oxygen gas which has been activated as ozone by, e.g., irradiating it with far ultraviolet rays may be used. Note that a seed layer of ruthenium may be formed by PVD such as sputtering before this preprocessing in the same manner as in the prior art.

The semiconductor substrate 101 is heated to, e.g., 300° C., and in this state, $Ru(EtCp)_2$ gas of 3 sccm and oxygen gas (additive gas) of 50 sccm are supplied onto the semiconductor substrate 101 in the processing vessel to set the total pressure to about 27 Pa. Sccm is a unit of flow rate, and one sccm represents that a fluid of 1 $cm^3$ at 0° C. and 1 atmosphere flows in 1 min.

Note that an organometallic compound (biscyclopentadienyl complex) of ruthenium having another metallocene structure such as ruthenocene $(Ru(C_5H_5)_2)$, a substance with a substituted ligand of the compound, another cyclopentadienyl complex, or their derivatives may be used as a source gas in place of $Ru(EtCp)_2$. Metallocene structures are comprised of two cyclopentadiene rings and various kinds of transition metals. Ozone gas or oxygen ion gas may also be supplied with the source gas, in place of oxygen gas.

In this manner, a ruthenium film 109 with a thickness of 20 to 30 nm is uniformly formed on the insulating film 108 and on the side and bottom surfaces of the opening 108a, as shown in FIG. 1B.

In a conventional film forming method without the above preprocessing, a ruthenium film was not formed on the insulating film 108 such as made of silicon oxide, as shown in Table 1. However, according to this embodiment, a ruthenium film was also formed on the film of silicon oxide or tantalum oxide. A ruthenium film was formed on a seed layer of ruthenium, regardless of the conventional method or the method according to this embodiment.

TABLE 1

|  | With Preprocessing | Without Preprocessing |
|---|---|---|
| On Seed Layer | formed | formed |
| On Silicon Oxide | formed | not formed |
| On Tantalum Oxide | formed | not formed |

If conditions in the preprocessing in which oxygen gas is supplied in a plasma state were made to vary, as shown in Table 2, a ruthenium film was formed in any combination of conditions. Note that "Gas Pressure" in Table 2 means the partial pressure of oxygen or argon supplied from a plasma generation section in preprocessing, and that "Output" means the output in generation of a plasma.

TABLE 2

| Preprocessing Conditions | | | | |
|---|---|---|---|---|
| Gas Pressure | Output | Kind of Gas | Processing Time | Determination |
| 222 Pa | 200 W | O2 | 300 sec | formed |
| 242 Pa | 200 W | O2 | 300 sec | formed |
| 444 Pa | 200 W | O2 | 300 sec | formed |
| 485 Pa | 200 W | O2 | 300 sec | formed |
| 667 Pa | 200 W | O2 | 300 sec | formed |
| 444 Pa | 100 W | O2 | 300 sec | formed |
| 444 Pa | 300 W | O2 | 300 sec | formed |
| 485 Pa | 200 W | O2 | 120 sec | formed |
| 444 Pa | 200 W | O2 | 600 sec | formed |
| 489 Pa | 200 W | Ar | 300 sec | formed |
| 533 Pa | 200 W | Ar | 300 sec | formed |

Figure 8A:
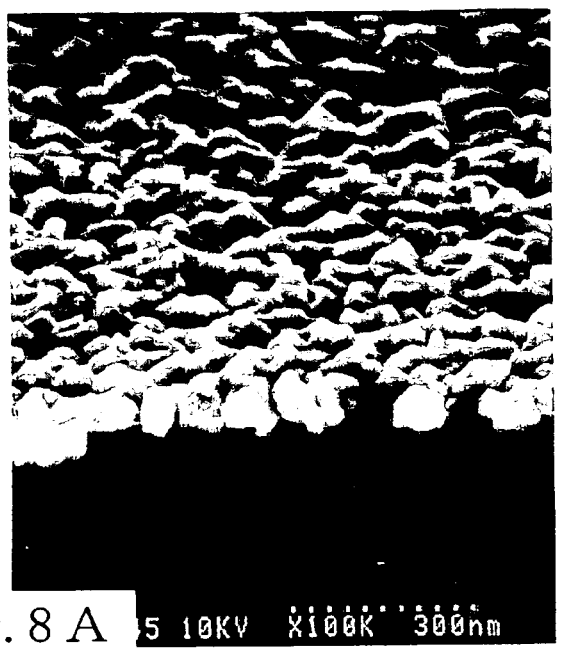
FIG. 8 shows electron micrographs by an SEM (Scanning Electron Microscope) of a formed ruthenium film.
Figure 8B:
Figure 8B:

When the processing time of film formation was set to be 300 sec under the same conditions as described above, a ruthenium film was formed with a good adhesion property on a silicon oxide film, as shown in the electron micrographs by SEM (Scanning Electron Microscope) of FIG. 8. Note that FIG. 8A shows a result obtained by viewing the surface of a sample inclined at 30°, and FIG. 8B shows a result obtained by viewing a section of the sample. The thickness of the film was measured by the total reflectance fluorescent X-ray measurement method to obtain a measurement of 39.1 nm. Note that values of the thickness of a film shown in the following description are measurement results obtained by the total reflectance fluorescent X-ray measurement method.

As described above, after the ruthenium film 109 is formed on the insulating film 108, it is removed except for the part on the opening 108a so that a cylindrical lower electrode 110 is formed in contact with the upper portion of the contact plug 107 in the opening 108a, as shown in FIG. 1C. Note that removal of the ruthenium film 109 may be performed by, e.g., etch back or chemical mechanical grinding.

Figure 2A:
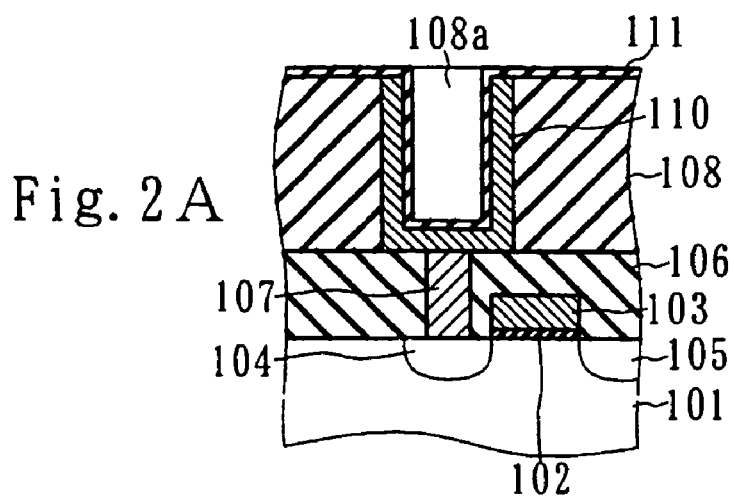
FIG. 2 shows sectional views following FIG. 1.

Then, as shown in FIG. 2A, a tantalum oxide film 111 is formed on the bottom and side surfaces of the cylindrical lower electrode 110 and insulating film 108 to a thickness of 5 to 15 nm by thermal CVD. After forming the tantalum oxide film 111, it is subjected to postprocessing such as annealing at about 400 to 750° C. in an oxygen atmosphere, thereby obtaining the characteristics of a capacitor insulating film.

Figure 2B:
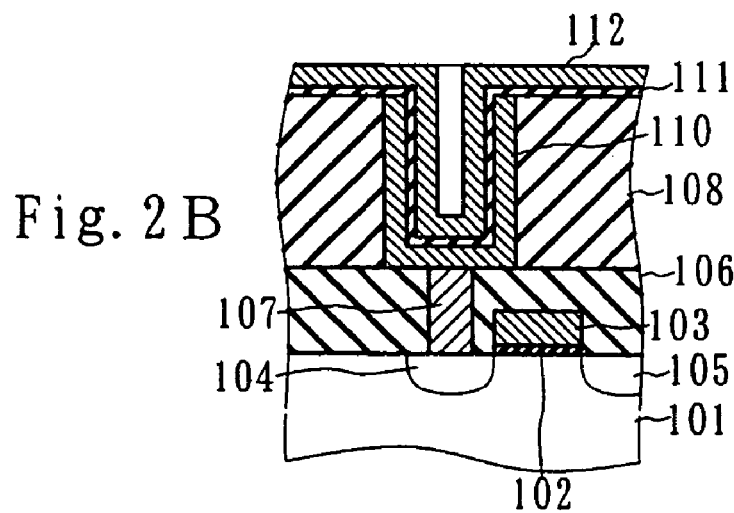

As shown in FIG. 2B, a ruthenium film 112 is formed on the tantalum oxide film 111 in the same manner as in FIG. 1B.

Figure 2C:
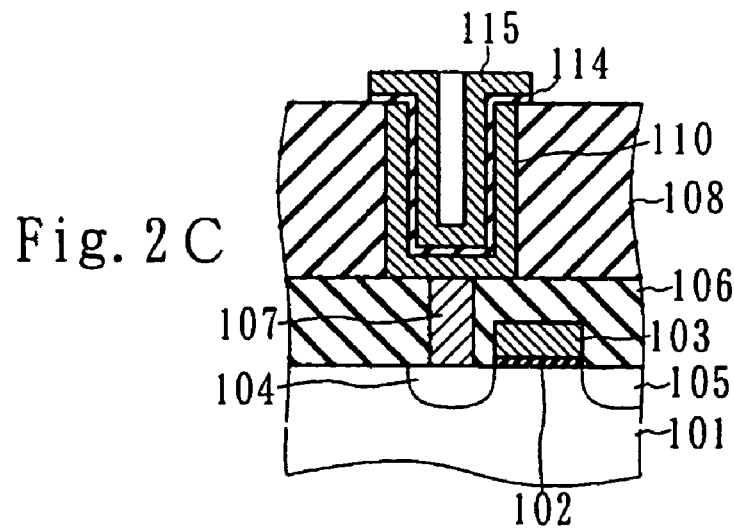

Then, a resist pattern is formed to cover the upper portion of the opening 108a, and the tantalum oxide film 111 and ruthenium film 112 are removed using this pattern as a mask. This makes it possible to form a cylinder capacitor comprised of the lower electrode 110, capacitor insulating film 114, and upper electrode 115, as shown in FIG. 2C.

Figure 3A:
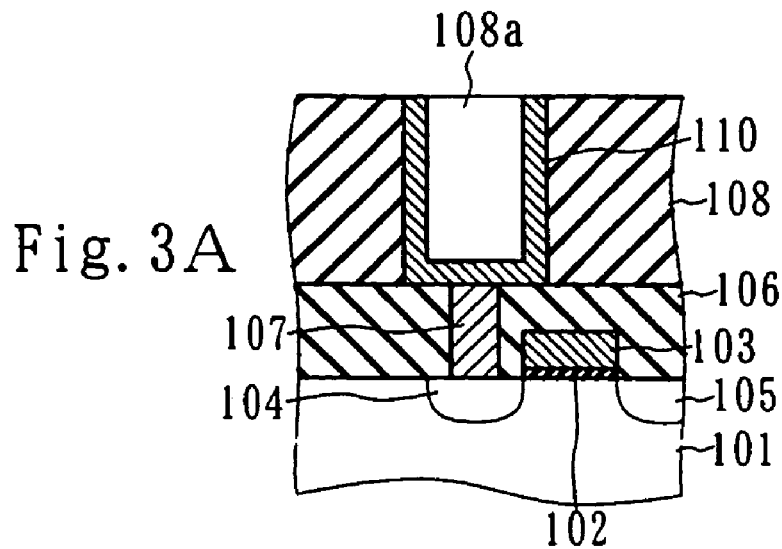
FIG. 3 shows sectional views of the steps in manufacturing a semiconductor device using a thin film forming method according to another embodiment of the present invention.

The outer side surface of the cylinder lower electrode 110 may be used as a capacitor, as shown in FIGS. 3 and 4. The manufacturing process in this case will be described. First, as shown in FIG. 3A, a gate electrode 103 is formed on a semiconductor substrate 101 through a gate insulating film 102. A source 104 and drain 105 are formed on the two sides of the gate electrode 103, respectively. An interlevel insulating film 106 is formed on the semiconductor substrate 101 to cover the gate electrode 103. A contact plug 107 is formed through the interlevel insulating film 106 to connect to, e.g., the source 104. In the same manner as in the above-described embodiment, a cylindrical lower electrode 110 is formed in contact with the upper portion of the contact plug 107 in the opening 108a.

Figure 3B:
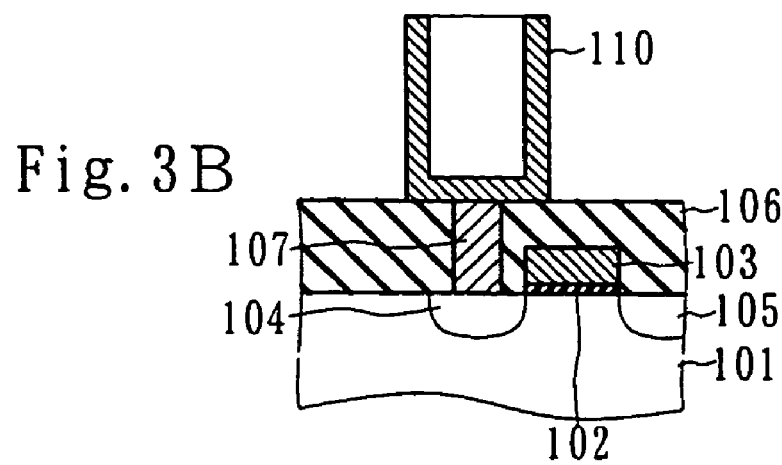

Next, as shown in FIG. 3B, an insulating film 108 is selectively removed using, e.g., hydrofluoric acid, so that the cylindrical lower electrode 110 is solely placed on the interlevel insulating film 106, with its outer side being exposed.

Figure 3C:
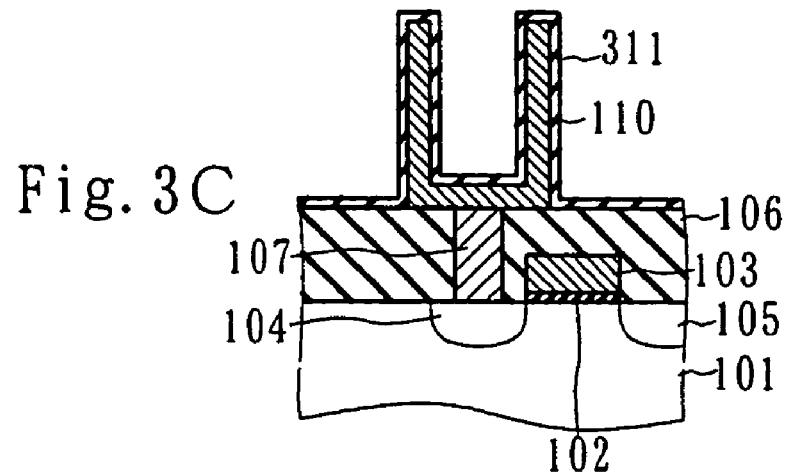

As shown in FIG. 3C, a tantalum oxide film 311 is formed on the bottom, inner and outer side surfaces of the cylindrical lower electrode 110 to a thickness of 5 to 15 nm by CVD. The formed tantalum oxide film 311 is subjected to postprocessing such as annealing at a temperature of 500 to 750° C. in an oxygen atmosphere, thereby obtaining the characteristics of a capacitor insulating film.

Figure 4A:
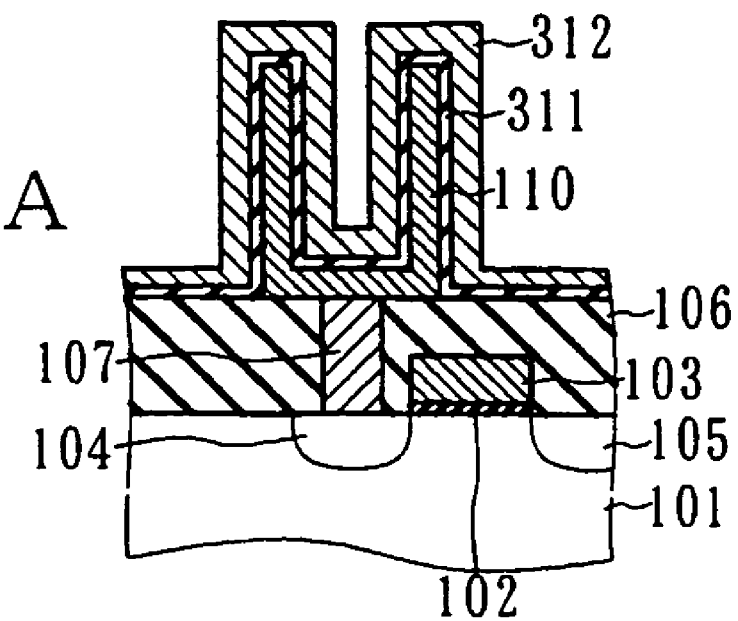
FIG. 4 shows sectional views following FIG. 3.

As shown in FIG. 4A, a ruthenium film 312 is formed on the tantalum oxide film 311 in the same manner as in FIG. 1B.

Figure 4B:
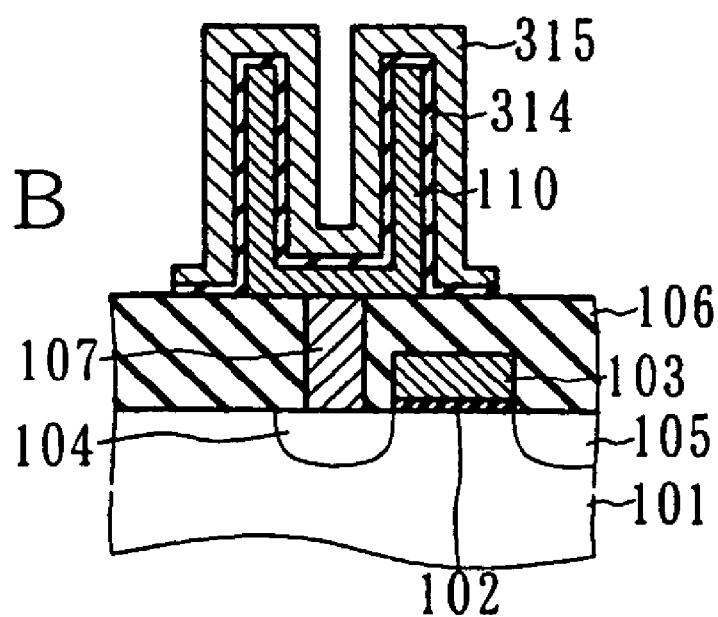

After that, the tantalum oxide film 311 and ruthenium film 312 are removed except for a capacitor formation region, so that a cylindrical capacitor comprised of the lower electrode 110, capacitor insulating film 314, and upper electrode 315 is formed, as shown in FIG. 4B.

In the above-described embodiment, activated oxygen gas or activated argon gas, which have been activated in the preprocessing, is supplied onto the semiconductor substrate 101 before ruthenium source gas is supplied onto the semiconductor substrate 101. The present invention is not limited to this. As in the following description, activated gas and activated additive gas may be supplied onto the semiconductor substrate 101, together with source gas of a transition metal such as ruthenium. That is, activated gas is used only in preprocessing or film formation.

A case wherein activated gas and activated additive gas were supplied together with ruthenium source gas will be described below.

First Embodiment

First of all, a semiconductor substrate on which an insulating film made of silicon oxide was formed was prepared. The semiconductor substrate was placed in a predetermined processing vessel and heated to 300° C. In this state, $Ru(EtCp)_2$ gas, oxygen gas, and activated oxygen gas (oxygen plasma gas) were supplied onto the semiconductor substrate in the processing vessel so as to set the partial pressures of $Ru(EtCp)_2$ gas, oxygen gas, and activated oxygen gas to 0.28 Pa, 4.4 Pa, and 44.5 Pa, respectively. The total pressure in the processing vessel was set to about 67 Pa. The processing time in this case was set to 60 sec. The oxygen plasma gas was generated at an output of 200 W with a remote plasma generator using microwaves.

Note that in all the embodiments to be described later including this embodiment, carrier gas of, e.g., an inert gas and the like, other than source gas, oxygen gas, and activated oxygen gas, is also introduced into the processing vessel and these gases are taken into consideration in the values of the total pressure in the processing vessel shown in the embodiments.

As a result, a ruthenium film was formed on the insulating film which has been formed on the semiconductor substrate to a thickness of about 8.8 nm. The ruthenium film was formed with a good adhesion property on the underlying insulating film of silicon oxide. In this case, the ruthenium was formed without preprocessing, unlike the above-described embodiment.

Second Embodiment

A case wherein a ruthenium film is formed after preprocessing will be described.

First of all, a semiconductor substrate on which an insulating film made of silicon oxide is formed is placed in a predetermined processing vessel and heated to 300° C. Oxygen gas activated by, e.g., conversion into a plasma was supplied onto the semiconductor substrate so that the surface of the insulating film of the semiconductor substrate was exposed to the activated oxygen gas. At this time, the total pressure in the processing vessel was set to 530 Pa, and the partial pressure of the oxygen plasma gas was set to 480 Pa. The processing time in this case was set to 300 sec.

After the above preprocessing, the semiconductor substrate was heated to 300° C., in the same manner as in the above-described embodiment. In this state, $Ru(EtCp)_2$ gas, oxygen gas, and activated oxygen plasma gas were supplied onto the semiconductor substrate in the processing vessel so as to set the partial pressures of $Ru(EtCp)_2$ gas, oxygen gas, and activated oxygen plasma gas to 0.28 Pa, 4.4 Pa, and 44.5 Pa, respectively. The total pressure in the processing vessel was set to about 67 Pa. The film forming time in this case was set to 60 sec. The oxygen plasma gas was generated at an output of 200 W with a remote plasma generator using microwaves.

Figure 9A:
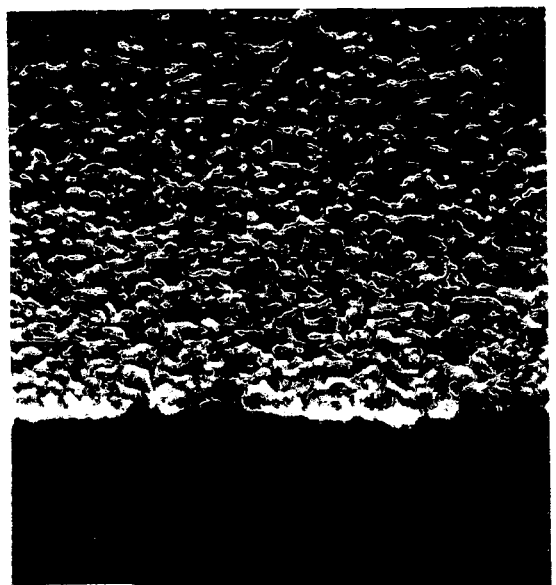
FIG. 9 shows electron micrographs by an SEM (Scanning Electron Microscope) of a formed ruthenium film.
Figure 9B:

As a result, a ruthenium film was formed on the insulating film which has been formed on the semiconductor substrate to a thickness of about 15.3 nm, as shown in the electron micrographs by SEM of FIG. 9. The ruthenium film was formed with a good adhesion property on the underlying insulating film of silicon oxide. Note that FIG. 9A shows a result obtained by viewing the surface of a sample inclined at 30°, and FIG. 9B shows a result obtained by viewing a section of the sample.

Third Embodiment

In the above description, oxygen gas and activated oxygen gas were supplied together with ruthenium source gas. However, the present invention is not limited to this. A ruthenium film may be formed by supplying activated oxygen gas (activated additive gas) with ruthenium source gas.

First of all, a semiconductor substrate was placed in a predetermined processing vessel and heated to 300° C. Oxygen gas activated by, e.g., conversion into a plasma was supplied onto the semiconductor substrate so that the surface of the insulating film of the semiconductor substrate was exposed to the activated oxygen gas. At this time, the total pressure in the processing vessel was set to 530 Pa, and the partial pressure of the oxygen plasma gas was set to 480 Pa. The processing time in this case was set to 300 sec.

After the above preprocessing, the semiconductor substrate was placed in a predetermined processing vessel and heated to 300° C. In this state, Ru(EtCp)$_2$ gas and activated oxygen plasma gas were supplied onto the semiconductor substrate in the processing vessel so as to set the partial pressures of Ru(EtCp)$_2$ gas and activated oxygen plasma gas to 0.28 Pa and 44.5 Pa, respectively. The total pressure in the processing vessel was set to about 67 Pa. The film forming time in this case was set to 60 sec. The oxygen plasma gas was generated at an output of 200 W with a remote plasma generator using microwaves.

As a result, a ruthenium film was formed on the insulating film which has been formed on the semiconductor substrate to a thickness of about 13.3 nm. The ruthenium film was formed with a good adhesion property on the underlying insulating film of silicon oxide.

Fourth Embodiment

A case which is the same as the above embodiment except that preprocessing is omitted will be described.

First of all, as in the above embodiment, a semiconductor substrate was placed in a predetermined processing vessel and heated to 300° C. In this state, Ru(EtCp)$_2$ gas and activated oxygen plasma gas were supplied onto the semiconductor substrate in the processing vessel so as to set the partial pressures of Ru(EtCp)$_2$ gas and activated oxygen plasma gas to 0.28 Pa and 44.5 Pa, respectively. The total pressure in the processing vessel was set to about 67 Pa. The film forming time in this case was set to 60 sec. The oxygen plasma gas was generated at an output of 200 W with a remote plasma generator using microwaves.

As a result, in this embodiment as well, a ruthenium film was formed on the insulating film which has been formed on the semiconductor substrate to a thickness of about 8.6 nm. The ruthenium film was formed with a good adhesion property on the underlying insulating film of silicon oxide.

Fifth Embodiment

In the above description, ruthenium source gas was supplied continuously for the film forming time. However, the film quality can be improved by supplying source gas intermittently, as will be described in the following embodiment.

A film forming method of supplying source gas intermittently will be described below. A semiconductor substrate was placed in a predetermined processing vessel and heated to 300° C. In this state, oxygen gas and activated oxygen plasma gas were supplied onto the semiconductor substrate in the processing vessel so as to set the partial pressures of oxygen gas and activated oxygen plasma gas to 4.4 Pa and 44.5 Pa, respectively. The total pressure in the processing vessel was set to about 67 Pa. The oxygen plasma gas was generated at an output of 200 W with a remote plasma generator using microwaves.

As described above, intermittent Ru(EtCp)$_2$ source gas supply was performed, that is, a cycle of gas supply for 10 sec and suspension of supply for 60 sec was repeated so as to set the partial pressure of the source gas to 0.28 Pa, while supplying oxygen gas and activated oxygen gas.

Figure 10:
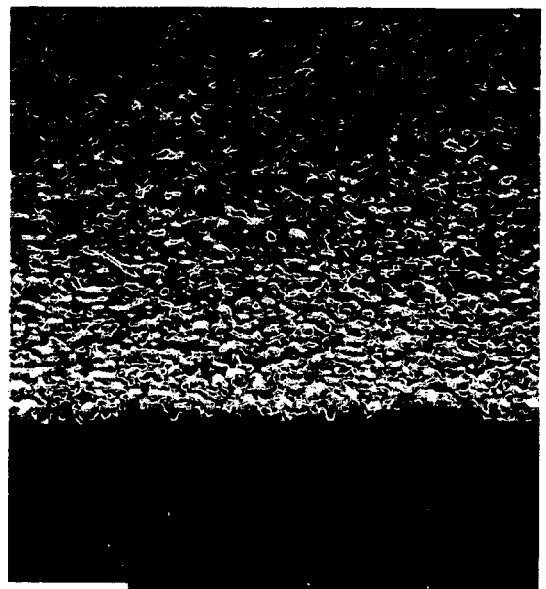
FIG. 10 shows electron micrographs by an SEM (Scanning Electron Microscope) of a formed ruthenium film.
Figure 10:
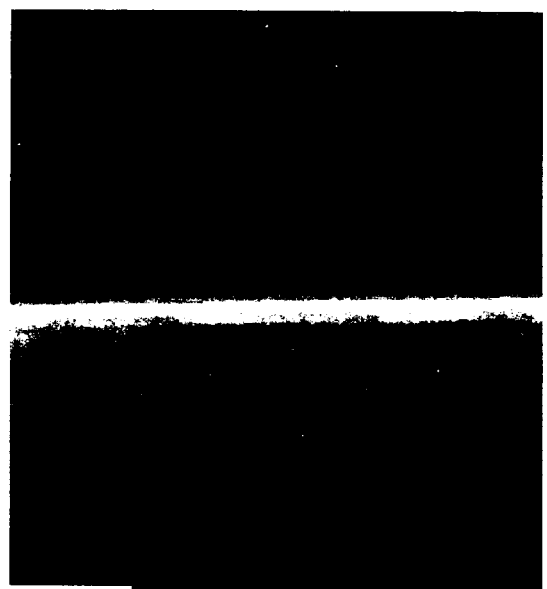

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 11.5 nm, as shown in the electron micrographs by SEM of FIG. 10. The ruthenium film was formed with a good adhesion property on the underlying insulating film of silicon oxide. Note that FIG. 10A shows a result obtained by viewing the surface of a sample inclined at 30°, and FIG. 10B shows a result obtained by viewing a section of the sample.

Sixth Embodiment

In the above embodiment, oxygen gas and activated oxygen gas were supplied. However, a ruthenium film can be formed similarly by supplying not oxygen gas but activated oxygen gas. First of all, a semiconductor substrate was placed in a predetermined processing vessel and heated to 300° C. In this state, activated oxygen plasma gas was supplied onto the semiconductor substrate in the processing vessel so as to set the partial pressure of activated oxygen plasma gas to 44.5 Pa. The total pressure in the processing vessel was set to about 67 Pa. The oxygen plasma gas was generated at an output of 200 W with a remote plasma generator using microwaves.

As described above, intermittent Ru(EtCp)$_2$ source gas supply was performed, that is, a cycle of gas supply for 10 sec and suspension of supply for 60 sec was repeated so as to set the partial pressure of the source gas to 0.28 Pa, while supplying activated oxygen gas.

Film formation processing was continued until a cycle of gas supply for 10 sec and suspension of supply for 60 sec was repeated six times and the total time of Ru(EtCp)$_2$ gas supply came to 60 sec. As a result, a ruthenium film was formed on the insulating film which has been formed on the semiconductor substrate to a thickness of about 9.7 nm. The ruthenium film was formed with a good adhesion property on the underlying insulating film of silicon oxide.

Seventh Embodiment

Next, a case wherein a ruthenium film is formed by intermittently supplying source gas after preprocessing will be described.

A semiconductor substrate was placed in a predetermined processing vessel and heated to 300° C. Then, oxygen gas activated by, e.g., conversion into a plasma was supplied onto the semiconductor substrate so that the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the above preprocessing, the semiconductor substrate was placed in the predetermined vessel and heated to 300° C. in the same manner as in the above embodiment. In this state, oxygen gas and activated oxygen plasma gas were supplied onto the semiconductor substrate in the processing vessel so as to set the partial pressures of oxygen gas and activated oxygen plasma gas to 4.4 Pa and 44.5 Pa, respectively. The total pressure in the processing vessel was set to about 67 Pa. The oxygen plasma gas was generated at an output of 200 W with a remote plasma generator using microwaves.

As described above, intermittent Ru(EtCp)$_2$ source gas supply was performed, that is, a cycle of gas supply for 10 sec and suspension of supply for 60 sec was repeated so as to set the partial pressure of the source gas to 0.28 Pa, while supplying oxygen gas and activated oxygen gas. Film formation processing was continued until a cycle of gas supply for 10 sec and suspension of supply for 60 sec was repeated six times and the total time of gas supply came to 60 sec.

Figure 11A:
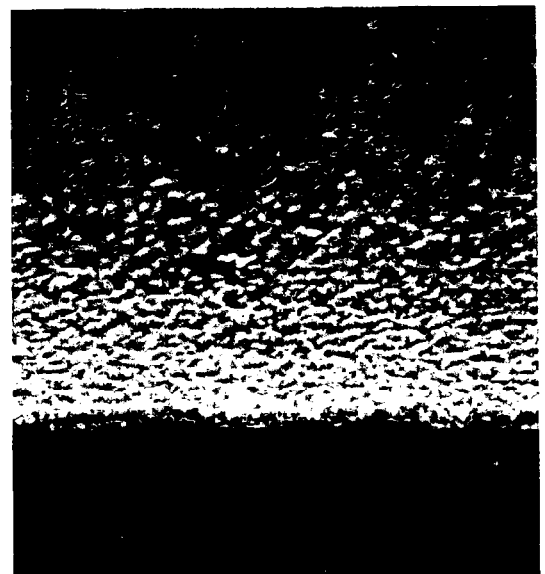
FIG. 11 shows electron micrographs by an SEM (Scanning Electron Microscope) of a formed ruthenium film.
Figure 11B:
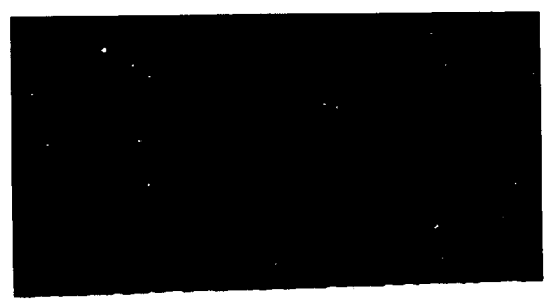
Figure 11B:

As a result, a ruthenium film was formed on the insulating film which has been formed on the semiconductor substrate to a thickness of about 21 nm, as shown in the electron micrographs by SEM of FIG. 11. The ruthenium film was formed with a good adhesion property on the underlying insulating film of silicon oxide. Note that FIG. 11A shows a result obtained by viewing the surface of a sample inclined at 30°, and FIG. 11B shows a result obtained by viewing a section of the sample. It can be seen from FIG. 11B that the surface of a film according to this embodiment has an excellent smoothness. An RMS value measured by an atomic force microscope was as low as 1.42 nm.

Figure 12A:
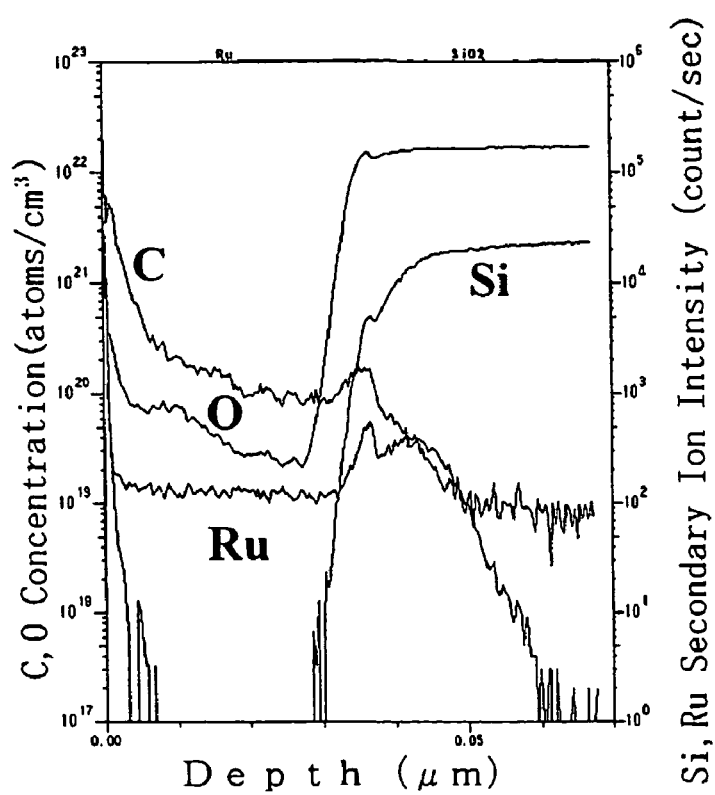
FIG. 12 shows graphs of measurement results obtained by the secondary ion mass spectrometry.
Figure 12B:
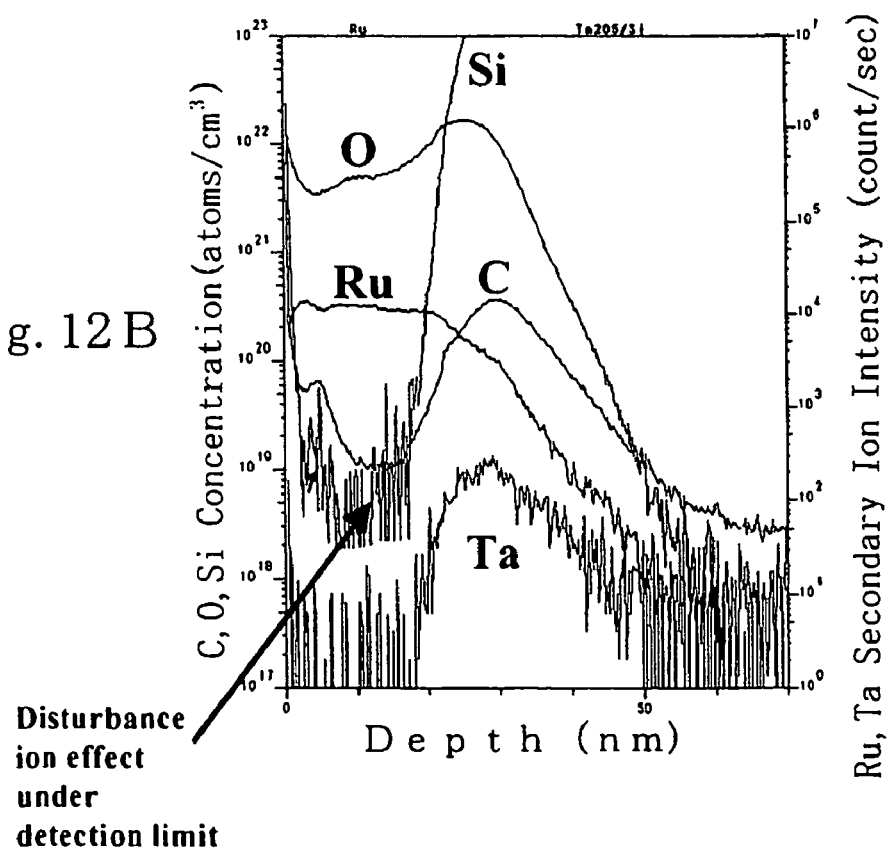

FIG. 12B shows the result obtained by measuring the impurity concentrations of C, O, Si and the like in the direction of thickness of a film (FIG. 12A) formed using this embodiment by the secondary ion mass spectrometry. A film formed by this embodiment has a much lower concentration of carbon (C) compared to a film formed on a conventional PVD Ru seed without activated gas by thermal CVD using source gas and oxygen. Therefore, according to this embodiment, not only an Ru film could be formed with a good adhesion property on an insulating film without a seed but also a high quality film which was smooth and has a low carbon concentration could be formed.

Eighth Embodiment

A ruthenium film can similarly be formed by intermittently supplying source gas while supplying not oxygen gas but activated oxygen gas after preprocessing. First, a semiconductor substrate was placed in a predetermined processing vessel and heated to 300° C. Then, oxygen gas activated by, e.g., conversion into a plasma was supplied onto the semiconductor substrate so that the surface of the insulating film of the semiconductor substrate was exposed to the activated oxygen gas. At this time, the total pressure in the processing vessel was set to 530 Pa, and the partial pressures of oxygen plasma gas was set to 480 Pa. The processing time was set to 300 sec.

After the above preprocessing, the semiconductor substrate was placed in the predetermined vessel and heated to 300° C., as shown in the above embodiment. In this state, oxygen plasma gas was supplied onto the semiconductor substrate in the processing vessel so as to set the partial pressure of oxygen plasma gas to 44.5 Pa. The total pressure in the processing vessel was set to about 67 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.28 Pa, while supplying activated oxygen gas. Film formation processing was continued until a cycle of gas supply for 10 sec and suspension of supply for 60 sec was repeated six times and the total time of gas supply came to 60 sec.

As a result, in this embodiment as well, a ruthenium film was formed on the insulating film which has been formed on the semiconductor substrate to a thickness of about 14.6 nm. The ruthenium film was formed with a good adhesion property on the underlying insulating film of silicon oxide.

In the above first to eighth embodiments, cases wherein oxygen gas is used as activated gas to be supplied in forming a film of ruthenium, which is a transition metal, have been described. However, the present invention is not limited to this. A ruthenium film can be formed in the following manner by supplying an inert gas such as argon together with source gas and oxygen gas.

Ninth Embodiment

First, a semiconductor substrate was placed in a predetermined processing vessel and heated to 300° C. In this state, $Ru(EtCp)_2$ gas, oxygen gas, and activated argon gas (Ar plasma gas) were supplied onto the semiconductor substrate in the processing vessel so as to set the partial pressures of $Ru(EtCp)_2$ gas, oxygen gas, and activated argon gas to 0.28 Pa, 4.4 Pa, and 44.5 Pa. The total pressure in the processing vessel was set to about 67 Pa. The film forming time in this case was set to 300 sec. The argon plasma gas was generated at an output of 200 W with a remote plasma generator using microwaves.

As a result, a ruthenium film was formed on the insulating film which has been formed on the semiconductor substrate to a thickness of about 59.3 nm. The ruthenium film was formed with a good adhesion property on the underlying insulating film of silicon oxide.

In this embodiment, preprocessing may be performed, as shown in the foregoing embodiments. For example, the semiconductor substrate was placed in the predetermined processing vessel and heated to 300° C. Then, oxygen gas activated by, e.g., conversion into a plasma was supplied onto the semiconductor substrate, and the surface of the insulating film of the semiconductor was exposed to the activated oxygen gas. After the preprocessing, the ruthenium film may be formed.

10th Embodiment

In the above embodiment, a film is formed while continuously supplying ruthenium source gas. However, a source gas may be supplied intermittently. A thin film forming method of intermittently supplying source gas will be described below.

A semiconductor substrate was placed in a predetermined processing vessel and heated to 300° C. In this state, oxygen gas and Ar plasma gas were supplied onto the semiconductor substrate in the processing vessel so as to set the partial pressures of oxygen gas and Ar plasma gas to 4.4 Pa and 44.5 Pa, respectively. The total pressure in the processing vessel was set to about 67 Pa. The Ar plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.28 Pa, while supplying oxygen gas and Ar plasma gas. Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 12.4 nm. The ruthenium film was formed with a good adhesion property on the underlying insulating film of silicon oxide.

11th Embodiment

A case which is the same as the above embodiment except that preprocessing was performed will be described.

First, a semiconductor substrate was placed in a predetermined processing vessel and heated to 300° C. In this state, oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and Ar plasma gas were supplied onto the semiconductor substrate in the processing vessel so as to set the partial pressures of oxygen gas and Ar plasma gas to 4.4 Pa and 44.5 Pa, respectively. The total pressure in the processing vessel was set to about 67 Pa. The Ar plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.28 Pa, while supplying oxygen gas and Ar plasma gas. Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 14.5 nm. The ruthenium film was formed with a good adhesion property on the underlying insulating film of silicon oxide.

12th Embodiment

The 12th embodiment will be described next.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 4.4 Pa and 44.1 Pa, respectively. The total pressure in the processing vessel was set to about 67 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.55 Pa, while supplying oxygen gas and activated oxygen gas.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 27.4 nm. The ruthenium film was formed with a good adhesion property on the underlying insulating film of silicon oxide.

13th Embodiment

The 13th embodiment will be described.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 4.4 Pa and 44.5 Pa, respectively. The total pressure in the processing vessel was set to about 67 Pa. The oxygen plasma gas was generated at an output of 200 W with a remote plasma generator using microwaves.

As described above, intermittent $Ru(EtCp)_2$ source gas supply was performed, that is, a cycle of gas supply for 20 sec and suspension of supply for 60 sec was repeated so as to set the partial pressure of the source gas to 0.28 Pa, while supplying oxygen gas and activated oxygen gas.

Film formation processing was continued until a cycle of gas supply for 20 sec and suspension of supply for 60 sec was repeated six times and the total time of gas supply came to 120 sec. As a result, a ruthenium film was formed on the insulating film which has been formed on the semiconductor substrate to a thickness of about 33.2 nm. The ruthenium film was formed with a good adhesion property on the underlying insulating film of silicon oxide.

14th Embodiment

The 14th embodiment will be described next.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 1.8 Pa and 17.7 Pa, respectively. The total pressure in the processing vessel was set to about 27 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.11 Pa, while supplying oxygen gas and activated oxygen gas.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 11.1 nm. The ruthenium film was formed with a good adhesion property on the underlying insulating film of silicon oxide.

15th Embodiment

The 15th embodiment will be described next.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 8.9 Pa and 88.5 Pa, respectively. The total pressure in the processing vessel was set to about 133 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.55 Pa, while supplying oxygen gas and activated oxygen gas.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 20.8 nm. The ruthenium film was formed with a good adhesion property on the underlying insulating film of silicon oxide.

16th Embodiment

The 16th embodiment will be described next.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 6.0 Pa and 36.2 Pa, respectively. The total pressure in the processing vessel was set to about 67 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.38 Pa, while supplying oxygen gas and activated oxygen gas.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 16.5 nm. The ruthenium film was formed with a good adhesion property on the underlying insulating film of silicon oxide.

17th Embodiment

The 17th embodiment will be described next.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 4.4 Pa and 44.5 Pa, respectively. The total pressure in the processing vessel was set to about 67 Pa. The oxygen plasma gas was generated at an output of 100 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 0.28 Pa, while supplying oxygen gas and activated oxygen gas.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 19.7 nm. The ruthenium film was formed with a good adhesion property on the underlying insulating film of silicon oxide.

18th Embodiment

The 18th embodiment will be described next.

First, a semiconductor substrate was placed in a predetermined processing vessel and heated to 300° C. Oxygen gas activated by, e.g., conversion into a plasma was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 480 Pa. The processing time in this case was set to 300 sec.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 4.4 Pa and 44.5 Pa, respectively. The total pressure in the processing vessel was set to about 67 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 30 sec was repeated so as to set the partial pressure of the source gas to 0.28 Pa, while supplying oxygen gas and activated oxygen gas.

Film formation processing was continued until a cycle of gas supply for 10 sec and suspension of supply for 30 sec was repeated six times and the total time of gas supply came to 60 sec. As a result, a ruthenium film was formed on the insulating film which has been formed on the semiconductor substrate to a thickness of about 16.1 nm. The ruthenium film was formed with a good adhesion property on the underlying insulating film of silicon oxide.

Note that a thin film forming method according to this embodiment is not limited to ranges indicated by the numerical values shown in the above embodiment. For example, in the above embodiment, when source gas was supplied continuously, the partial pressures of $Ru(EtCp)_2$ gas as the ruthenium source gas, oxygen gas, and activated oxygen gas are set to 0.28 Pa, 4.4 Pa, and 44 Pa. However, this embodiment is not limited to this.

Preferably, when a film is to be formed by continuously supplying a source gas, the total pressure falls within the range of 13 to 667 Pa, the flow rate of $Ru(EtCp)_2$ gas falls within the range of 1.6 to 125 sccm, the flow rate of oxygen gas falls within the range of 0 to 2,000 sccm, and the flow rate of activated oxygen gas falls within the range of 15 to 2,000 sccm. Assume that under these ranges, the partial pressure ratio of $Ru(EtCp)_2$ gas/(oxygen gas+activated oxygen gas) was set within the range of 1/3 to 1/500, and that gas was supplied so that the balance is Ar gas as a carrier or for back side purge. Also, assume that the partial pressures of $Ru(EtCp)_2$ gas, oxygen gas, and activated oxygen gas are set to 0.005 to 250 Pa, 0 to 610 Pa, and 0.09 to 610 Pa, respectively. In this case, a ruthenium film can be formed similarly. When a source gas is to be supplied intermittently, a ruthenium film can be formed in the same ranges.

For example, a ruthenium film can be formed by a method according to the next embodiment.

19th Embodiment

The 19th embodiment will be described next.

First, a semiconductor substrate was placed in a predetermined processing vessel and heated to 300° C. Oxygen gas activated by, e.g., conversion into a plasma using microwaves of 200 W was supplied onto the semiconductor substrate, and the surface of the insulating film of the semiconductor substrate was exposed to the activated oxygen gas. At this time, the total pressure in the processing vessel was set to 530 Pa, and the partial pressure of oxygen plasma gas was set to 484 Pa. The processing time in this case was set to 300 sec. Note that a plurality of holes each having a diameter of 130 nm and a depth of 650 nm are formed in the insulating film of the semiconductor substrate.

After the preprocessing, the semiconductor substrate was placed in the predetermined processing vessel and heated to 300° C. In this state, oxygen gas and oxygen plasma gas were supplied onto the semiconductor substrate in the processing vessel so as to set the partial pressures of oxygen gas and oxygen plasma gas to 4.4 Pa and 43.8 Pa, respectively. The total pressure in the processing vessel was set to about 67 Pa. The oxygen plasma gas was generated at an output of 200 W with a remote plasma generator using microwaves.

As described above, intermittent $Ru(EtCp)_2$ source gas supply was performed, that is, a cycle of gas supply for 10 sec and suspension of supply for 60 sec was repeated so as to set the partial pressure of the source gas to 1.3 Pa, while supplying oxygen gas and activated oxygen gas.

Film formation processing was continued until a cycle of gas supply for 10 sec and suspension of supply for 60 sec was repeated eight times and the total time of gas supply came to 80 sec. As a result, a ruthenium film was formed on the insulating film which has been formed on the semiconductor substrate to a thickness of about 30 nm. The ruthenium film was formed with a good adhesion property on the underlying insulating film of silicon oxide. Also, a hole formed in the insulating film attained good step coverage of 80% or more, which was defined by the thickness of the lower portion in the hole/the thickness of the upper portion in the hole.

20th Embodiment

The 20th embodiment will be described next.

First, a semiconductor substrate on which an insulating film made of silicon oxide was formed was placed in a predetermined processing vessel and heated to 300° C. Oxygen gas activated using an ozonizer was supplied onto the semiconductor substrate, and the surface of the insulating film of the semiconductor substrate was exposed to the activated oxygen gas. At this time, the partial pressure of activated oxygen gas was set to 61 Pa. The processing time in this case was set to 300 sec.

After the preprocessing, in the same manner as in the above embodiments, the semiconductor substrate was heated to 300° C. In this state, $Ru(EtCp)_2$ gas, oxygen gas, and oxygen gas activated by the ozonizer were supplied onto the semiconductor substrate in the processing vessel so as to set the partial pressures of $Ru(EtCp)_2$ gas, oxygen gas, and activated oxygen gas to 0.28 Pa, 4.4 Pa and 44.5 Pa, respectively. The total pressure in the processing vessel was set to about 67 Pa. The film forming time in this case was set to 300 sec.

As a result, a ruthenium film was formed on the insulating film which has been formed on the semiconductor substrate to a thickness of 60 nm. The ruthenium film was formed with a good adhesion property on the underlying insulating film of silicon oxide.

21st Embodiment

The 21st embodiment will be described next. In this embodiment, the above-described preprocessing was not performed. First, a semiconductor substrate on which an insulating film made of silicon oxide was formed was placed in a predetermined processing vessel and heated to 300° C. In this state, oxygen gas activated by an ozonizer was supplied onto the semiconductor substrate in the processing vessel so as to set the partial pressure of activated oxygen gas to 46.9 Pa. The total pressure in the processing vessel was set to about 67 Pa.

As described above, intermittent $Ru(EtCp)_2$ source gas supply was performed, that is, a cycle of gas supply for 10 sec and suspension of supply for 60 sec was repeated so as to set the partial pressure of the source gas to 1.4 Pa, while supplying oxygen gas activated by the ozonizer.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 50 nm. The ruthenium film was formed with a good adhesion property on the underlying insulating film of silicon oxide.

22nd Embodiment

The 22nd embodiment will be described next.

First, a semiconductor substrate on which an insulating film made of silicon oxide was formed was placed in a predetermined processing vessel and heated to 300° C. Oxygen gas activated using an ozonizer was supplied onto the semiconductor substrate, and the surface of the insulating film of the semiconductor substrate was exposed to the activated oxygen gas. At this time, the partial pressure of activated oxygen gas was set to 61 Pa. The processing time in this case was set to 300 sec.

After the preprocessing, the semiconductor substrate was placed in the predetermined processing vessel and heated to 300° C. In this state, oxygen gas activated by the ozonizer was supplied onto the semiconductor substrate in the processing vessel so as to set the partial pressure of activated oxygen gas to 46.9 Pa. The total pressure in the processing vessel was set to about 67 Pa.

As described above, intermittent $Ru(EtCp)_2$ source gas supply was performed, that is, a cycle of gas supply for 10 sec and suspension of supply for 60 sec was repeated so as to set the partial pressure of the source gas to 1.4 Pa, while supplying oxygen gas activated by the ozonizer.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 55 nm. The ruthenium film was formed with a good adhesion property on the underlying insulating film of silicon oxide.

23rd Embodiment

The 23rd embodiment will be described next. In this embodiment, the above-described preprocessing was not performed. First, a semiconductor substrate on which an insulating film made of silicon oxide was formed was placed in a predetermined processing vessel and heated to 300° C. In this state, oxygen gas activated by an ozonizer was supplied onto the semiconductor substrate in the processing vessel so as to set the partial pressure of oxygen gas activated by the ozonizer to 93 Pa. The total pressure in the processing vessel was set to about 133 Pa.

As described above, intermittent $Ru(EtCp)_2$ source gas supply was performed, that is, a cycle of gas supply for 10 sec and suspension of supply for 60 sec was repeated so as to set the partial pressure of the source gas to 2.8 Pa, while supplying oxygen gas activated by the ozonizer.

Film formation processing was continued until a cycle of gas supply for 10 sec and suspension of supply for 60 sec was repeated six times and the total time of gas supply came to 60 sec. As a result, a ruthenium film was formed on the insulating film which has been formed on the semiconductor substrate to a thickness of about 55 nm. The ruthenium film was formed with a good adhesion property on the underlying insulating film of silicon oxide.

As has been described above, assume that a ruthenium film is formed by CVD using $Ru(EtCp)_2$ gas and oxygen gas. If the ratio of $Ru(EtCp)_2$ gas to oxygen gas (activated oxygen gas)={$Ru(EtCp)_2$ gas:(oxygen gas+activated oxygen gas)} (partial pressure ratio) exceeds 1:3, that is, the partial pressure of $Ru(EtCp)_2$ gas increases, supplied oxygen gas becomes insufficient for reaction, thus interfering with formation of the film.

If the partial pressure ratio becomes lower than 1:500, that is, the partial pressure of oxygen gas increases excessively, and that of $Ru(EtCp)_2$ gas decreases excessively, oxygen in the ruthenium film increases, thus increasing the resistivity of the film.

In the above description, a case wherein a ruthenium film is formed to form an electrode made of ruthenium has been described. However, the present invention is not limited to this. The same effect can be obtained by applying the present invention to CVD using a metal film of another transition metal. In the method, oxygen is added to a complex salt (cyclopentadienyl complex compound) as a source gas made of at least one ring structure of cyclopentadiene with or without organic group bond and a transition metal to form a film.

For example, the present invention can be applied to a CVD method in which oxygen gas is added to a source gas, $Pt(C_2H_5C_5H_4)(CH_3)_3$ or $Ir(C_2H_5C_5H_4)(1, 5\text{-} C_8H_{12})$, which is a complex salt made of platinum or iridium and at least one ring structure of cyclopentadiene with or without another organic group bond.

In the above description, a case wherein oxygen gas is used as an additive gas has been described. However, the present invention is not limited to this. $N_2O$ (nitrous oxide) gas, NO (nitric oxide) gas, and vapor ($H_2O$) may be used.

Figure 5:
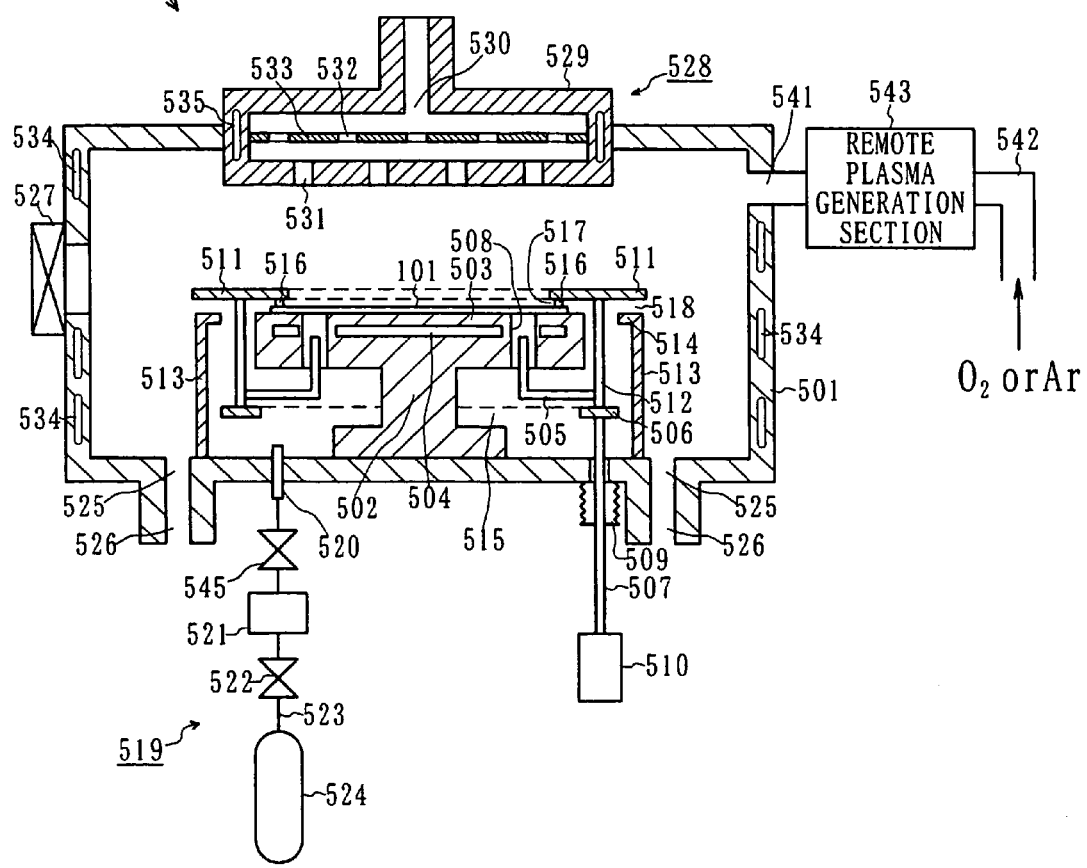
FIG. 5 is a sectional view of an arrangement of a thin film forming apparatus according to an embodiment of the present invention.

Next, a thin film forming apparatus according to an embodiment of the present invention for forming a ruthenium film will be described below. FIG. 5 is a schematic sectional view of an arrangement of a thin film forming apparatus according to the embodiment of the present invention. A film forming apparatus 500 shown in FIG. 5 comprises a processing vessel 501, which is formed from aluminum and the like in the shape of a cylinder or box. In the processing vessel 501, a susceptor 503 standing from the bottom on a supporting column 502 is provided for placing a semiconductor substrate 101 as an object. The susceptor 503 is made of, e.g., a carbon material or an aluminum compound such as aluminum nitride and has, e.g., a resistance heater 504 as a heating means buried therein.

A plurality of, e.g., three L-shaped lifter pins 505 (two of them are shown in FIG. 5) are provided upright with respect to a support member 506. The support member 506 moves vertically by a push rod 507 arranged through the bottom of the processing vessel. The support member 506 causes the lifter pins 505 to move through lifter pin holes 508 extending through the susceptor 503, thereby lifting the semiconductor substrate 101.

The lower end of the push rod 507 is connected to an actuator 510 through an expansible bellows 509 for maintaining the airtight state in the processing vessel 501.

A clamp ring member 511 made of a ceramic such as aluminum nitride and having an almost ring-like shape conforming to the edge of the disk-like semiconductor substrate 101 is provided in the periphery of the susceptor 503 for holding the edge of the semiconductor substrate 101 and fixing it to the susceptor 503 side. The clamp ring member 511 is connected to the ring support member 506 through a connecting rod 512 and arranged to move vertically together with the lifter pin 505. Note that the lifter pin 505, connecting rod 512, and the like are formed from alumina or the like.

A cylindrical partitioning wall 513 made of, e.g., aluminum and standing from the bottom of the processing vessel 501 is formed around the susceptor 503. A bent portion 514 is formed by bending the upper end of the partitioning wall 513 in the horizontal direction. An inert gas purge chamber 515 is formed on the lower surface side of the susceptor 503 by providing the cylindrical partitioning wall 513. The upper surface of the bent portion 514 is almost flush with the upper surface of the susceptor 503 and is spaced from the periphery of the susceptor 503 at a short distance. The connecting rod 512 extends through the gap between them.

A plurality of contact projections 516 arranged almost equidistantly are formed on the lower surface in the inner periphery of the clamp ring member 511. In clamping, the lower surface of the contact projection 516 abuts against the upper surface of the semiconductor substrate 101 in the edge to press this substrate. Note that the contact projection 516 has a diameter of about 1 mm and a height of about 50 µm. In clamping, a ring-like first gas purge gap 517 is formed in a portion corresponding to it. The overlap amount (flow path length of the first gas purge gap 517) of the edge of the semiconductor substrate 101 and the inner periphery of the clamp ring member 511 in clamping is about several millimeters.

The edge of the clamp ring member 511 is located above the upper end bent portion 514 of the partitioning wall 513, and a ring-like second gas purge gap 518 is formed between the edge and bent portion 514. The width of the second gas purge gap 518 is about 500 µm, which is about ten times wider than the first gas purge gap 517. The overlap amount (flow path length of the second gas purge gap 518) of the edge of the clamp ring member 511 and the bent portion 514 is, e.g., about 10 mm. This makes it possible to flow an inert gas in the inert gas purge chamber 515 from the gaps 517 and 518 to the processing space side.

A gas nozzle 520 forming part of an inert gas supply means 519 is formed in the bottom of the processing vessel 501. A gas flow path 523 is connected to the gas nozzle 520, and a flow rate controller 521 like a mass flow controller and opening/closing valves 522 and 545 are disposed midway along the gas flow path 523. An Ar gas source 524 for storing an inert gas such as Ar gas is connected to the other end of the gas flow path 523. He gas or the like may be used as an inert gas in place of Ar gas.

An exhaust port 525 is provided in the edge of the bottom of the processing vessel 501, which is connected to an exhaust path 526. The exhaust path 526 is connected a vacuum pump (not shown) for maintaining the vacuum degree in the processing vessel to a predetermined degree. A gate valve 527 to be opened/closed in loading/unloading a semiconductor substrate is formed in the side wall of the processing vessel 501.

In the ceiling portion of the processing vessel 501 facing the susceptor 503, a shower head section 528 is disposed as a processing gas supply means for introducing source gas and the like into the processing vessel 501. The shower head section 528 comprises a head body 529 formed from aluminum or the like in a cylindrical shape. A gas inlet port 530 is formed in its ceiling portion. Gas sources of Ru(EtCp)$_2$ gas, oxygen gas and the like, which are required for the processing, is connected to the gas inlet port 530 through a gas path so as to allow controlling the flow rate.

A number of gas spray holes 531 are formed substantially over the lower portion of the head body 529 for emitting the gas supplied to the head body 529 to the processing space and arranged to emit the gas onto the entire surface of a semiconductor substrate. As needed, a diffusion plate 533 with numerous gas dispersion holes 532 is disposed in the head body 529 to supply the gas onto the semiconductor substrate more uniformly. Cartridge heaters 534 and 535 are respectively provided as temperature adjusting means in the side wall of the processing vessel 501 and that of the shower head section 528 to maintain temperatures of the side wall and shower head section which contact gas at predetermined temperatures, respectively.

In addition, a thin film forming apparatus according to this embodiment is arranged so that an activating gas supply port 541 is provided for introducing activated oxygen gas or an inert gas such as argon to introduce activated gas. Oxygen gas or argon gas was supplied from a gas source (not shown) through a gas inlet path 542 to a remote plasma generation section (gas activating means) 543, and the oxygen gas which has been converted into a plasma and activated by the remote plasma generation section 543 is introduced into the processing vessel 501. The activated gas introduced into the processing vessel 501 will activate the surface of the semiconductor substrate 101 in preprocessing and facilitate decomposition of the source gas of a transition metal and formation of a film when supplied with the source gas of the transition metal in film forming.

The remote plasma generation section 543 is so arranged as to obtain an activated gas by exciting the gas using microwaves and converting it into a plasma. Other than microwaves, ICP plasma, parallel-plate plasma, ECR plasma, DC plasma, RF plasma and the like may be used. In place of the remote plasma generation section, another activating means may be used. For example, an ozonizer which converts oxygen gas into ozone using far ultraviolet rays may be used.

Next, film formation processing using a film forming apparatus with the above-described arrangement will be described. First, the gate valve 527 arranged in the side wall of the processing vessel 501 is opened to load the semiconductor substrate 101 with a transfer arm (not shown) into the processing vessel 501. The semiconductor substrate 101 is passed to the lifter pins 505 which have been lifted. The lifter pins 505 are lowered by lowering the push rod 507 to place the semiconductor substrate 101 on the susceptor 503. The edge of the semiconductor substrate 101 is pressed with the weight of the clamp ring member 511 and fixed by further lowering the push rod 507. Note that the susceptor 503 has been heated in advance to a predetermined temperature by the built-in resistance heater 504 to immediately raise the temperature of the semiconductor substrate 101 to a predetermined process temperature and maintain it at the process temperature.

Then, Ar gas is introduced at a predetermined flow rate from the gas nozzle 520 of the inert gas supply means 519 located below the susceptor 503 to the inert gas purge chamber 515.

Oxygen gas is introduced from the gas source (not shown) to the remote plasma generation section 543 to activate the oxygen gas by generating a plasma. The activated oxygen gas is introduced through the inert gas supply port 541 into the processing vessel 501, and the semiconductor substrate 101 is exposed to the activated oxygen gas.

The processing of activating a film formation target region by exposing the region to the activated oxygen gas is continued for a predetermined period. After that, the operation of the remote plasma generation section 543 is stopped, the supply of activated oxygen gas is stopped, and the internal atmosphere in the processing vessel 501 is exhausted from the exhaust port 525, thereby exhausting activated oxygen gas from the processing vessel 501.

Ru(EtCp)$_2$ gas as a source gas was supplied by a predetermined amount with oxygen gas from the processing gas source (not shown) to the shower head section 528 to supply it almost uniformly from the gas spray holes 531 in the lower surface of the head body 529 to the processing space in the processing vessel 501. At the same time, the pressure in the processing vessel 501 was set to a predetermined pressure by exhausting the internal atmosphere from the exhaust port 525.

The supplied source gas and oxygen gas come into contact with the activated film formation target region to cause a predetermined chemical reaction. The bond of ruthenium and an organic group in Ru(EtCp)$_2$ is cut off due to the presence of oxygen. Ruthenium is left in the film formation target region, while the organic components are evaporated and dispersed. As a result, ruthenium is deposited on the film formation target region of the semiconductor substrate 101 to form a ruthenium film.

As described above, a case wherein after preprocessing using activated oxygen gas as an activated gas, Ru(EtCp)$_2$ gas as a source gas and oxygen gas as an additive gas were supplied to form a ruthenium film has been described. However, the activated gas is not limited to oxygen gas, and an inert gas such as argon may be used. Alternatively, activated gas, additive gas and source gas may be supplied to form a film made of a transition metal which forms the source gas in an apparatus with the same arrangement. The activated gas may be supplied in advance to perform preprocessing before this processing.

Alternatively, a source gas and activated additive gas may be supplied to form a film made of a transition metal which forms the source gas in an apparatus with the same arrangement. The activated gas may be supplied in advance to perform preprocessing before this processing.

Alternatively, a source gas may be supplied intermittently in forming a film according to the above-described methods.

In the film formation, the pressure of Ar gas as an inert gas supplied to the inert gas purge chamber 515 below the susceptor 503 is a slightly higher than the pressure of the source gas in the processing space. This Ar gas gradually flows through the first gas purge gap 517 having a width of about 50 μm and the second gas purge gap 518 having a width of about 500 μm to the above processing space.

Therefore, a source gas does not enter the inert gas purge chamber 515 through the first gas purge gap 517, thereby preventing an undesired ruthenium film from being deposited on the side and lower surface sides of the semiconductor substrate 101. Similarly, deposition of an undesired ruthenium film on the surface of the susceptor 503 can be prevented. In the above description, the clamp ring member 511 and semiconductor substrate 101 come into contact with each other through the contact projections 516. However, the inner edge of the clamp ring member 511 and edge of the semiconductor substrate 101 may be arranged to come into linear contact with each other.

If too much Ar gas flows out to the above processing space through the first gas purge gap 517, the flow of the source gas is avoided from reaching the surface of the semiconductor substrate 101. Accordingly, a ruthenium film is avoided from being deposited in the proper portion on the semiconductor substrate, and film formation is affected adversely. Thus, appropriate control of the flow rate of Ar gas in the upward direction is required.

Note that the activated gas is introduced from the side portion of the processing vessel 501 in the film forming apparatus of FIG. 5. In this case, the semiconductor substrate 101 may be rotated by a rotary mechanism (not shown) so as to allow the activated gas to act on the surface of the semiconductor substrate 101 uniformly. The activated gas may be introduced from the shower head section 528 in place of introducing the gas from the side portion. In this case, a plate for blocking the flow path may be provided between the introduction portion of the activated gas and head body 529 for preventing the activated gas from flowing excessively onto the central portion of the semiconductor substrate 101. When a source gas and additive gas or activated gas are introduced from the shower head, the activated gas and source gas may react with each other within the shower head, depending on the mixing ratio of the gases. In order to avoid reaction in the shower head, a post-mixing scheme may be employed. In this scheme, the gases pass through separate flow paths and are mixed in the processing vessel 501.

Figure 6:
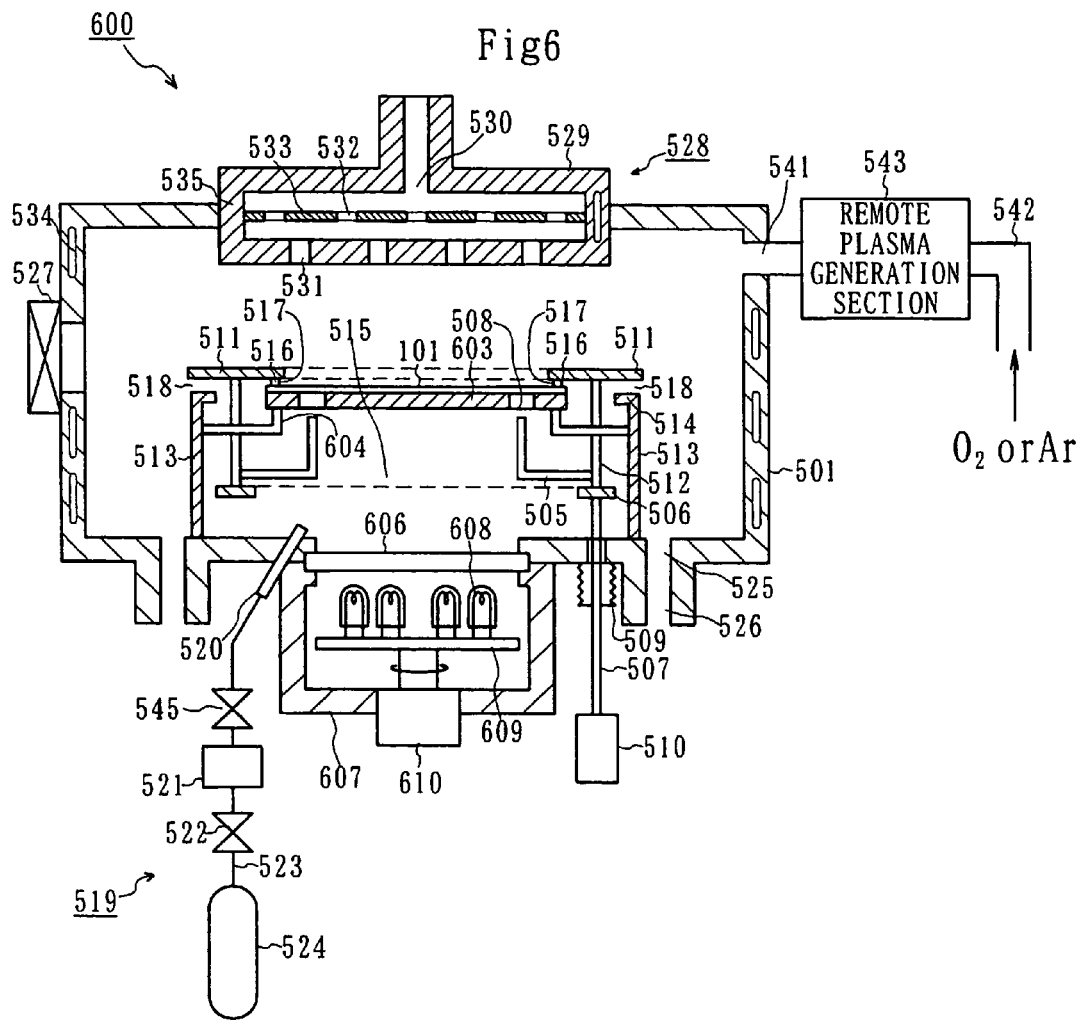
FIG. 6 is a sectional view of an arrangement of a thin film forming apparatus according to another embodiment of the present invention.

In the film forming apparatus in FIG. 5, a substrate to be processed is heated by the resistance heater 504. The present invention is not limited to this. As shown in FIG. 6, the substrate may be heated using a lamp. The film forming apparatus in FIG. 6 will be described below. Note that the same reference numerals as in FIG. 5 denote the same parts in FIG. 6, and a description thereof will be omitted.

In a film forming apparatus 600 shown in FIG. 6, a susceptor 603 is made of, e.g., a carbon material or an aluminum compound such as aluminum nitride having a thickness of about 1 mm. The susceptor 603 is supported by three support arms 604 (two of them are shown) extending from the upper inner wall of the cylinder partitioning wall 513 made of, e.g., aluminum and standing from the bottom of the processing vessel 501.

In the bottom of the processing vessel immediately below the susceptor 603, a transparent window 606 made of a heat wave-transmitting material such as quartz is provided airtightly, and a box-like heating chamber 607 is provided below to surround the window 606. A plurality of heating lamps 608 as heating means are attached to a rotary table 609 serving as a reflecting mirror in the heating chamber 607. The rotary table 609 is rotated by a rotary motor 610 provided in the bottom of the heating chamber 607 through a rotating shaft. Therefore, the lower surface of the susceptor 603 is irradiated with heat waves emitted from the heating lamps 608 through the transparent window 606 and heated.

In the film forming apparatus 600 as well, the activating gas supply port 541 is provided. Oxygen gas and argon gas were supplied from a gas source (not shown) through the gas inlet path 542 to the remote plasma generation section 543 to introduce the oxygen gas which has been converted into a plasma and activated by the remote plasma generation section 543 and the like into the processing vessel 501. Also, in the film forming apparatus 600, Ar gas is introduced from the gas nozzle 520 to the inert gas purge chamber 515 below the susceptor 603 and flows out to the processing space side through the first gas purge gap 517 on the inner periphery side of the clamp ring member 511 and second gas purge gap 518 on the outer periphery side, thus preventing an undesired film from being deposited on the side and lower surface sides of a substrate to be processed.

Figure 7:
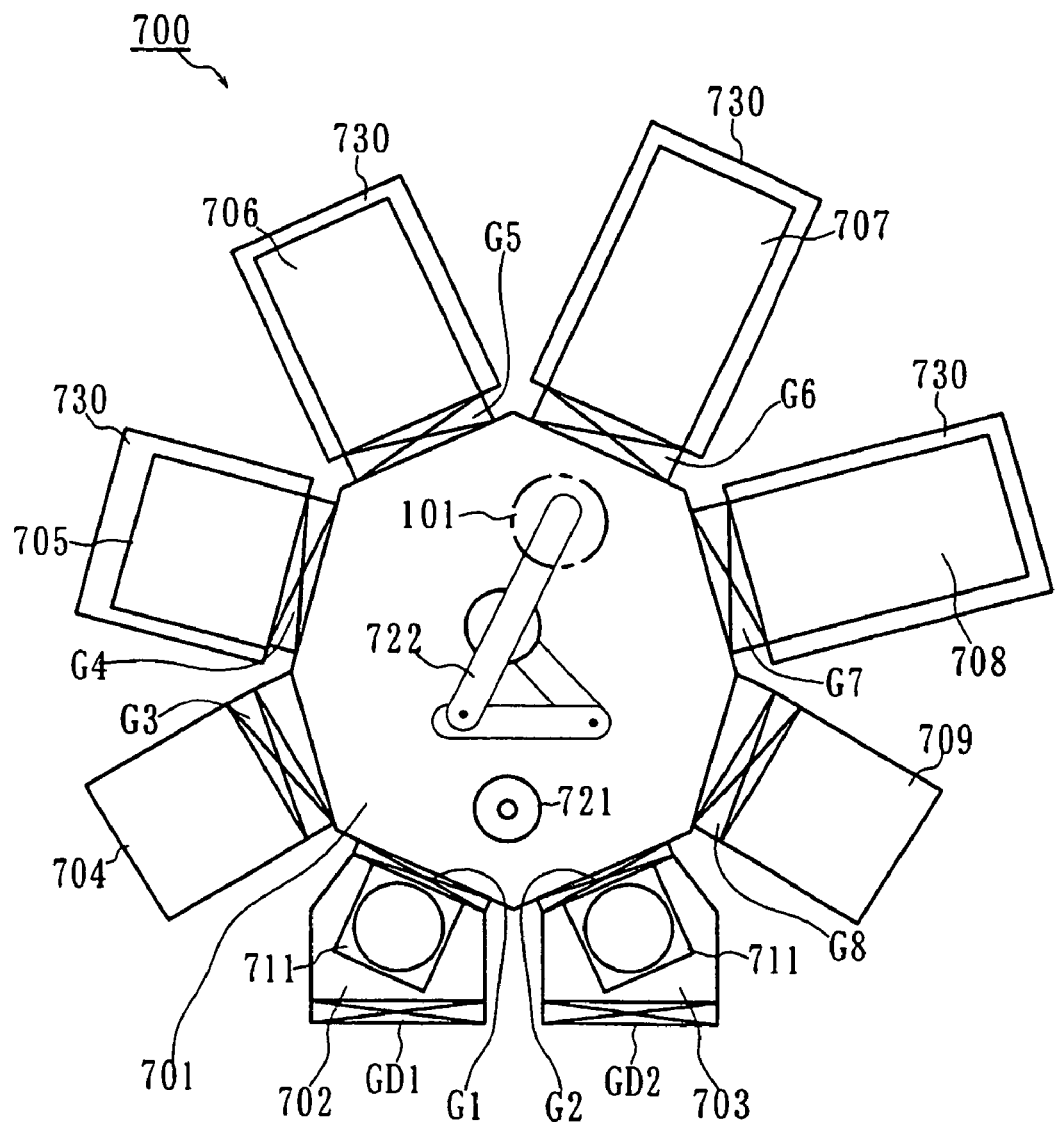
FIG. 7 is a sectional view of an arrangement of a thin film forming apparatus according to another embodiment of the present invention.

The above-described film forming apparatus may be applied to a cluster tool apparatus capable of continuous processing in FIG. 7. As shown in FIG. 7, a cluster tool apparatus 700 has a common transfer chamber 701 formed from, e.g., aluminum in its center in the shape of an octagonal container. The common transfer chamber 701 is connected to the first and second cassette chambers 702 and 703, moisture removal processing chamber 704, the first film formation preprocessing chamber 705, the second film formation postprocessing chamber 706, the first and second film formation processing chambers 707 and 708, and cooling processing chamber 709, which are all located around the chamber 701, through gate valves G1 to G8 capable of opening/closing respective chambers.

The moisture removal processing chamber 704 is a processing chamber for removing moisture and the like on the surface of a semiconductor substrate by heating the substrate, as needed. The film forming apparatus shown in FIG. 5 or 6 is applied to the first film formation processing chamber 707. The second film formation processing chamber 708 is a processing chamber for forming tantalum oxide by thermal CVD.

The first film formation preprocessing chamber 705 is a processing chamber for performing preprocessing of the film forming apparatus shown in FIG. 5 or 6. The second film formation postprocessing chamber 706 is a processing chamber for irradiating tantalum oxide formed in the second film formation processing chamber 708 with ozone, ultraviolet rays, or remote oxygen plasma gas to reform a tantalum oxide film.

The cooling processing chamber 709 is a processing chamber for cooling a substrate on which a film has been formed by thermal CVD to a handling temperature. Gate doors GD1 and GD2 which can be opened/closed are provided for loading/unloading a cassette 711 capable of accommodating, e.g., 25 substrates into/from the first and second cassette chambers 702 and 703, and a cassette table (not shown) which can be lifted/lowered is provided in each of the cassette chambers 702 and 703. Each of the cassette chambers 702 and 703 can supply an inert gas such as $N_2$ gas and can be evacuated.

A rotary positioning mechanism 721 for positioning a substrate taken inside and a transfer arm 722 comprised of a multi-joint arm mechanism which is stretchable and rotatable while holding a substrate are arranged in the common transfer chamber 701. A substrate can be loaded/unloaded between chambers by stretching, bending, and rotating the transfer arm 722. The common transfer chamber 701 can supply an inert gas such as $N_2$ gas and can be evacuated.

An airtight box 730 is provided around each processing chamber to cover the processing chamber. Each of the airtight boxes 730 has the same arrangement and is designed to prevent processing gas from leaking out around the box. Thus, high airtightness is not required. The airtight box 730 has a clean gas inlet port for introducing a clean gas at one portion and a gas exhaust port at another portion spaced from one portion. This gas exhaust port is connected to a factory exhaust duct to cause the gas to flow throughout the airtight box 730. If gas leakage occurs, the processing gas is exhausted to the factory exhaust duct side along the gas flow.

Next, the flow of processing by the cluster tool apparatus 700 will be described. Semiconductor substrates 101 to be processed accommodated in the cassette 711 is loaded through the gate door GD1 into, e.g., the first cassette chamber 702. The gate door GD1 is closed to evacuate the chamber to the above-described base pressure. The base pressure in this case means the lowest pressure obtained by evacuation in this state. When the pressure in the first cassette chamber 702 reaches the base pressure, the gate valve G1 is opened. The transfer arm 722 in the common transfer chamber 701, the pressure of which is kept at the base pressure in advance, extends and takes out one of the semiconductor substrates 101 to be processed. The semiconductor substrate 101 is positioned by detecting the orientation flat of the semiconductor substrate 101 using the rotary positioning mechanism 721.

The positioned substrate 101 is loaded through the open gate valve G3 into the moisture removal processing chamber 704, the pressure of which is kept at the base pressure in advance, using the transfer arm 722. In this chamber, the semiconductor substrate 101 is heated to remove moisture and the like on the semiconductor substrate 101 by evaporation. This moisture removal processing is performed, only if necessary. If not, this step may be omitted to advance to the next step.

The semiconductor substrate 101, which has or has not undergone moisture removal, is loaded through the gate valve G4 into the first film formation preprocessing chamber 705, the pressure of which is kept at the base pressure in advance. In this chamber, the above preprocessing using oxygen gas activated by the remote plasma, ozone, or the like is performed.

Then, the semiconductor substrate 101 is introduced through the gate valve G6 (corresponding to reference numeral 527 in FIG. 5) into the first film formation processing chamber 707, the pressure of which is kept at the base pressure in advance, to form a ruthenium film.

After exhausting remaining source gas from the first film formation processing chamber 707, its pressure was set to the base pressure. The gate valve G6 is opened, and the semiconductor substrate 101 is unloaded using the transfer arm 722. The semiconductor substrate 101 is loaded through the open gate valve G8 into the cooling processing chamber 709, the pressure of which is kept at the base pressure in advance. In this chamber, the semiconductor substrate 101 is cooled to a predetermined handling temperature. The cooled semiconductor substrate 101 is accommodated through the gate valve G2 in the cassette 711 in the second cassette chamber 703, the pressure of which is kept at the base pressure in advance.

After that, the semiconductor substrate 101 is subjected to processing such as etch back and CMP to process the ruthenium film into a lower electrode shape. Then, the semiconductor substrate 101 is loaded into the first cassette chamber 702 to form a tantalum oxide film and ruthenium film for an upper electrode in succession, as described above. If moisture removal is necessary, the semiconductor substrate 101 is loaded into the moisture removal chamber 704 to be subjected to moisture removal processing.

The semiconductor substrate 101 is loaded through the open gate valve G7 into the second film formation processing chamber 708, the pressure of which is kept at the base pressure in advance, to form the tantalum oxide film.

Then, the semiconductor substrate 101 is loaded through the gate valve G5 into the second film formation postprocessing chamber 706, the pressure of which is kept at the base pressure in advance, to reform the tantalum oxide film by irradiating the substrate with ozone, ultraviolet rays, or remote oxygen plasma gas.

Furthermore, the semiconductor substrate 101 is loaded into the first film formation preprocessing chamber 705 and then into the first film formation processing chamber 707. When preprocessing for ruthenium film formation is performed, and a ruthenium film is formed, the state shown in FIG. 2B or 4A is obtained.

In this manner, this cluster tool apparatus 700 can process a semiconductor substrate to be processed sequentially.

In the above embodiment, the first film formation preprocessing chamber 705 and first film formation processing chamber 707, or the second film formation processing chamber 708 and second film formation postprocessing chamber 706 are separately provided. However, as in the film forming apparatus shown in FIG. 5 or 6, the first film formation preprocessing and first film formation processing may be performed in a single processing vessel. The second film formation processing and second film formation postprocessing may be performed in a single processing chamber (not shown). Assume that the processing temperature of the semiconductor substrate 101 can be changed promptly. In this case, since the preprocessing and postprocessing have common processing contents such as irradiation with remote oxygen plasma gas, ozone, ultraviolet rays and the like, the first film formation preprocessing and second film formation post-processing may be performed in a single processing vessel.

As has been described above, according to the present invention, an excellent effect can be obtained. More specifically, a thin film can be formed with a good step coverage and good quality even when the underlying layer has a small stepped shape with a high aspect ratio.

As has been described above, a thin film forming method and thin film forming apparatus according to the present invention are suitable when manufacturing a semiconductor device comprised of smaller elements.

The invention claimed is:

1. A thin film forming method comprising the acts of:
generating an activated gas with a remote plasma generator;
causing radicals but not ions in the activated gas to come into contact with a film formation region of a substrate to be processed to perform preprocessing of the substrate; and
forming a thin metal film made of a transition metal on the film formation region of the substrate which has been subjected to the preprocessing by thermal CVD using a source gas of the transition metal and oxygen gas.

2. A thin film forming method according to claim 1, wherein the activated gas is activated oxygen.

3. A thin film forming method according to claim 1, wherein the activated gas is an activated inert gas.

4. A thin film forming method according to claim 3, wherein the inert gas is argon gas.

5. A thin film forming method according to claim 1, wherein the source gas of the transition metal is an organometallic compound comprised of the transition metal and at least one cyclopentadiene ring.

6. A thin film forming method according to claim 5, wherein the transition metal is ruthenium.

7. A thin film forming method according to claim 1, wherein the activated gas is obtained by activating a gas in a location spaced from the substrate.

8. A thin film forming method according to claim 1, wherein the activated gas is generated by exciting a gas using microwaves.

9. A thin film forming method comprising supplying a source gas of a transition metal, additive gas, and activated gas to a thin film formation region of a substrate to be processed to form a thin metal film made of the transition metal by CVD, wherein the source gas of the transition metal is supplied onto the thin film formation region of the substrate by repeating a cycle of supply for a first time and then suspension of supply for a second time a predetermined number of times.

10. A thin film forming method according to claim 9, further comprising preprocessing the substrate by causing an activated gas to come into contact with the film formation region of the substrate to be processed, and then forming a thin metal film made of the transition metal by CVD.

11. A thin film forming method according to claim 9, wherein the activated gas contains activated oxygen.

12. A thin film forming method according to claim 9, wherein the activated gas is an activated inert gas.

13. A thin film forming method according to claim 9, wherein the additive gas contains oxygen.

14. A thin film forming method according to claim 9, wherein the activated gas or activated additive gas is obtained by activating a gas in a location spaced from the substrate.

15. A thin film forming method according to claim 9, wherein the activated gas or activated additive gas is generated by exciting a gas using microwaves.

16. A thin film forming method according to claim 9, wherein the source gas of the transition metal is an organometallic compound comprised of the transition metal and at least one cyclopentadiene ring.

17. A thin film forming method according to claim 16, wherein the transition metal is ruthenium.

18. A thin film forming method comprising the acts of:
supplying an activated additive gas onto a thin film formation region of a substrate to be processed,
supplying a source gas of a transition metal onto the thin film formation region of the substrate to be processed by repeating a cycle of supply for a first time and then suspension of supply for a second time a predetermined number of times, and
forming a thin metal film made of the transition metal by CVD.

19. A thin film forming method according to claim 18, wherein the additive gas contains oxygen.

20. A thin film forming method according to claim 18, wherein the activated additive gas is obtained by activating a gas in a location spaced from the substrate.

21. A thin film forming method according to claim 18, wherein the activated additive gas is generated by exciting a gas using microwaves.

22. A thin film forming method according to claim 18, wherein the source gas of the transition metal is an organometallic compound comprised of the transition metal and at least one cyclopentadiene ring.

23. A thin film forming method according to claim 22, wherein the transition metal is ruthenium.

24. A thin film forming method comprising the acts of:
generating an activated gas with a remote plasma generator:
causing radicals but not ions in the activated gas to come into contact with a film formation region of a substrate to be processed to perform preprocessing of the substrate; and
forming a thin metal film made of a transition metal on the film formation region of the substrate which has been subjected to the preprocessing by CVD using a source gas of the transition metal and additive gas, wherein the activated gas contains activated oxygen.

25. A thin film forming method according to claim 24, wherein the activated gas is obtained by activating any one of oxygen gas, nitrous oxide gas, nitric oxide gas, and vapor.

26. A thin film forming method according to claim 25, wherein the activated gas is activated oxygen gas.

27. A thin film forming method comprising the acts of:
generating an activated gas with a remote plasma generator;
causing radicals but not ions in the activated gas to come into contact with a film formation region of a substrate to be processed to perform preprocessing of the substrate; and
forming a thin metal film made of a transition metal on the film formation region of the substrate which has been subjected to the preprocessing by CVD using a source gas of the transition metal and additive gas, wherein the activated gas is an activated inert gas.

28. A thin film forming method according to claim 27, wherein the activated gas is activated argon gas.

29. A thin film forming method comprising the acts of:
generating an activated gas with a remote plasma generator:
causing radicals but not ions in the activated gas to come into contact with a film formation region of a substrate to be processed to perform preprocessing of the substrate; and
forming a thin metal film made of a transition metal on the film formation region of the substrate which has been subjected to the preprocessing by CVD using a source gas of the transition metal and additive gas, wherein the additive gas contains oxygen.

30. A thin film forming method according to claim 29, wherein the additive gas is any one of oxygen gas, nitrous oxide gas, nitric oxide gas, and vapor.

31. A thin film forming method according to claim 30, wherein the additive gas is oxygen gas.

32. A thin film forming method comprising the acts of:
generating an activated gas with a remote plasma generator;
causing radicals but not ions in the activated gas to come into contact with a film formation region of a substrate to be processed to perform preprocessing of the substrate; and
forming a thin metal film made of a transition metal on the film formation region of the substrate which has been subjected to the preprocessing by CVD using a source gas of the transition metal and additive gas.

33. A thin film forming method comprising the acts of:
causing an activated gas to come into contact with a film formation region of a substrate to be processed to perform preprocessing of the substrate; and
forming a thin metal film made of a transition metal on the film formation region of the substrate which has been subjected to the preprocessing by CVD using a source gas of the transition metal and additive gas, wherein the activated gas is generated by exciting a gas using microwaves.

34. A thin film forming method comprising the acts of:
generating an activated gas with a remote plasma generator;
causing radicals but not ions in the activated gas to come into contact with a film formation region of a substrate to be processed to perform preprocessing of the substrate; and
forming a thin metal film made of a transition metal on the film formation region of the substrate which has been subjected to the preprocessing by CVD using a source gas of the transition metal and additive gas, wherein the source gas of the transition metal is an organometallic compound comprised of the transition metal and at least one cyclopentadiene ring.

35. A thin film forming method according to claim 34, wherein the transition metal is ruthenium.

36. A thin film forming method comprising the acts of:
supplying an activated gas onto a thin film formation region of a substrate; and
supplying a source gas of a transition metal and a gas containing oxygen onto the thin film formation region so as to form a thin metal film made of the transition metal by CVD, wherein the source gas is supplied by repeating a cycle of supply for a first time and then suspension of supply for a second time a predetermined number of times.

37. A thin film forming method for supplying a source gas of a transition metal and activated gas onto a substrate to be processed to form a thin metal film made of the transition metal by CVD, said method comprising the acts of:
supplying the activated gas; and
supplying the source gas by repeating a cycle of supply for a first time and then suspension of supply for the second time a predetermined number of times while the activated gas is supplied.

* * * * *